United States Patent
Okamoto

(10) Patent No.: US 10,120,043 B2
(45) Date of Patent: Nov. 6, 2018

(54) MAGNETIC RESONANCE IMAGING APPARATUS AND COIL DEVICE

(71) Applicant: TOSHIBA MEDICAL SYSTEMS CORPORATION, Otawara-Shi (JP)

(72) Inventor: Kazuya Okamoto, Saitama (JP)

(73) Assignee: TOSHIBA MEDICAL SYSTEMS CORPORATION, Otawara-Shi (JP)

( * ) Notice: Subject to any disclaimer, the term of this patent is extended or adjusted under 35 U.S.C. 154(b) by 444 days.

(21) Appl. No.: 15/053,285

(22) Filed: Feb. 25, 2016

(65) Prior Publication Data

US 2016/0259020 A1 Sep. 8, 2016

(30) Foreign Application Priority Data

Mar. 2, 2015 (JP) .................. 2015-040373

(51) Int. Cl.
| | | |
|---|---|---|
| *G01V 3/00* | (2006.01) | |
| *G01R 33/34* | (2006.01) | |
| *G01R 33/30* | (2006.01) | |
| *G01R 33/385* | (2006.01) | |
| *G01R 33/345* | (2006.01) | |
| G01R 33/36 | (2006.01) | |
| G01R 33/421 | (2006.01) | |

(52) U.S. Cl.
CPC ..... *G01R 33/34092* (2013.01); *G01R 33/307* (2013.01); *G01R 33/3453* (2013.01); *G01R 33/34076* (2013.01); *G01R 33/385* (2013.01); G01R 33/34007 (2013.01); G01R 33/3657 (2013.01); G01R 33/4215 (2013.01)

(58) Field of Classification Search
CPC .. A61B 5/055; G01R 33/5608; G01R 33/543; G01R 33/385; G01R 33/5659
See application file for complete search history.

(56) References Cited

U.S. PATENT DOCUMENTS

| | | | | |
|---|---|---|---|---|
| 2004/0239327 A1* | 12/2004 | Heid | ................. | G01R 33/34046 324/318 |
| 2005/0258832 A1* | 11/2005 | Eberlein | .......... | G01R 33/34046 324/318 |
| 2006/0279283 A1* | 12/2006 | Nistler | ................. | G01R 33/422 324/318 |

FOREIGN PATENT DOCUMENTS

JP 2-218346 A 8/1990

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

In one embodiment, a magnetic resonance apparatus includes a gradient coil configured to be cylindrically-shaped and to apply a gradient magnetic field to a hollow region into which an object is inserted, the hollow region being formed, the hollow region being formed inside the gradient coil; and an RF coil configured to include a resonance circuit whose plural connecting conductors are folded back at one end side of the gradient coil so that the resonance circuit extends from the hollow region to an outer region of the gradient coil.

13 Claims, 21 Drawing Sheets

MAGNETIC RESONANCE IMAGING APPARATUS AND COIL DEVICE

CROSS-REFERENCE TO RELATED APPLICATIONS

This application is based upon and claims the benefit of priority from Japanese Patent Application No. 2015-40373 filed on Mar. 2, 2015, the entire contents of which are incorporated herein by reference.

FIELD

Embodiments described herein relate generally to a magnetic resonance imaging apparatus and a coil device.

BACKGROUND

MRI is an imaging method which magnetically excites nuclear spin of an object placed in a static magnetic field with an RF pulse having the Larmor frequency and reconstructs an image based on MR signals generated due to the excitation. The above-described MRI means magnetic resonance imaging, the RF pulse means a radio frequency pulse, and the MR signal means a nuclear magnetic resonance signal.

As one of methods of improving resolution of an image in MRI, a local gradient coil configured to generate and apply a strong magnetic field to a local region is known.

DETAILED DESCRIPTION

Figure 1:
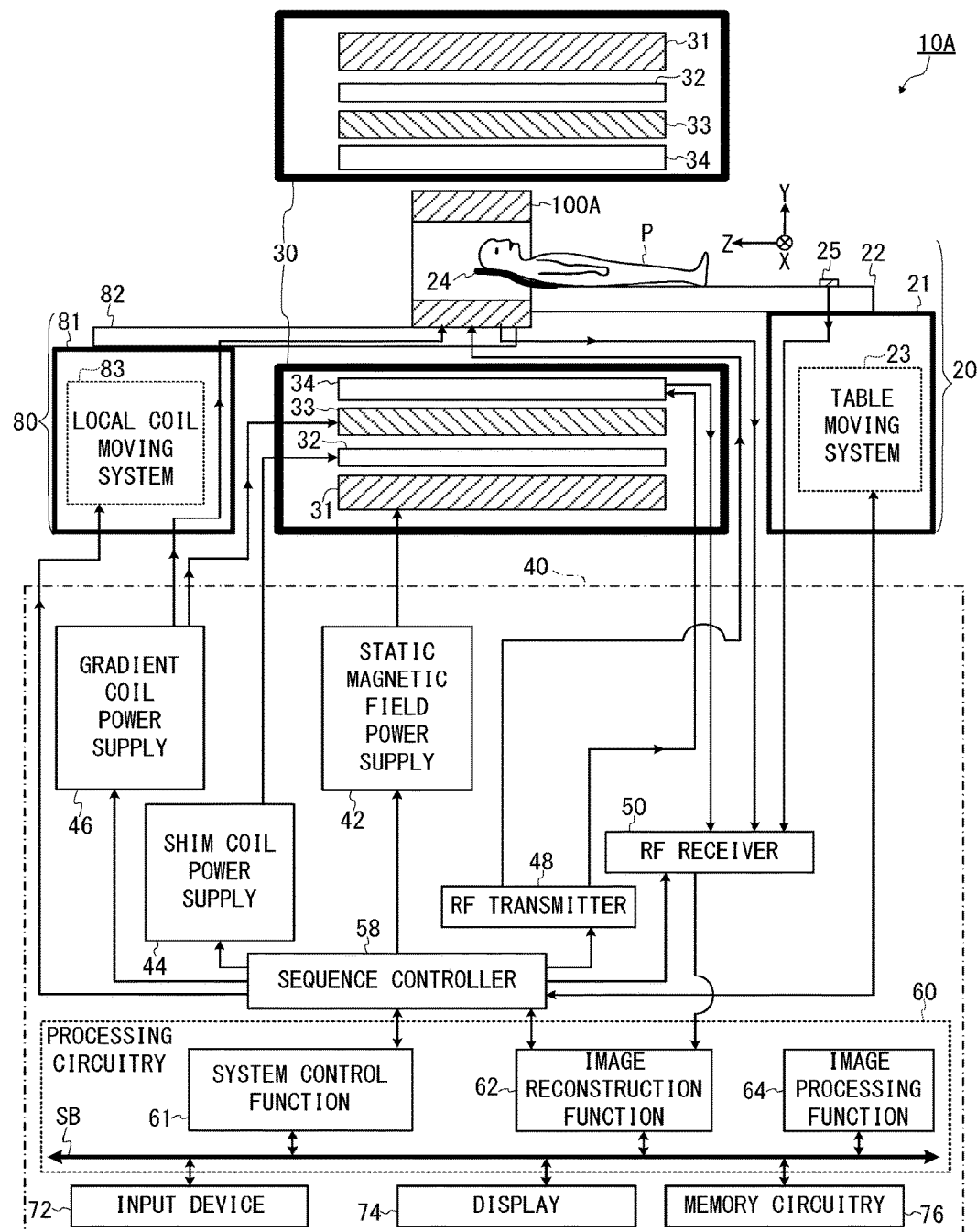
FIG. 1 is a block diagram showing an example of overall configuration of an MRI apparatus of the first embodiment.

According to at least one of embodiments, a magnetic resonance imaging apparatus includes a gradient coil configured to be cylindrically-shaped and to apply a gradient magnetic field to a hollow region into which an object is inserted, the hollow region being formed, the hollow region being formed inside the gradient coil; and an RF coil configured to include a resonance circuit whose plural connecting conductors are folded back at one end side of the gradient coil so that the resonance circuit extends from the hollow region to an outer region of the gradient coil.

Hereinafter, viewpoints of the inventor and the concept worked out by the inventor will be first described, and then specific embodiments will be described.

When a local gradient coil is used, the local gradient coil is inserted into a bore (i.e., the imaging space) of an ordinary gantry which includes a whole-body RF coil, a gradient coil, and a static magnetic field magnet, for example. When the local gradient coil is used, the whole-body RF coil and the gradient coil in the gantry do not operate. When the end side of a patient in the body axis direction is an imaging part (i.e., the target region to be imaged) as an example, it is easy to insert such an imaging part into inside of the local gradient coil.

Thus, a local gradient coil is useful for imaging of a head or a foot. Further, since a local gradient coil can locally form a strong gradient magnetic field, it can improve resolution and it is advantageous for a fast imaging. On the other hand, since a local gradient coil is designed to be inserted into the space of the bore of an ordinary gantry, its size is limited.

In the present specification, a device which includes the above-described local gradient coil and a local RF coil is referred to as a local coil device. The above-described local RF coil is a resonance circuit equipped with a function of applying RF pulses to a localized region of an imaging space, and some local RF coils are further equipped with a function of receiving MR signals. The above-described imaging space means, for example, a space in a gantry 30 (FIG. 1) into which an object P is inserted and to which a static magnetic field is applied.

In addition, the term "local" in a local coil device, a local RF coil, and a local gradient coil is assumed to mean not a part of an object but a part of the imaging space. This is because imaging of the entire body is capable by a local coil device if an object is small like a baby.

As an example here, consider three-layered structure of a cylindrical local coil device in which the first layer configured as a local gradient coil is arranged outermost, the third layer configured as a local RF coil is arranged innermost, and the second layer configured as an RF shield is arranged between the outermost and innermost layers. In this structure, inside of the third layer (i.e., inside of the local RF coil) is insertion space into which an object is inserted. When the external diameter of the first layer (i.e., the local gradient coil) is fixed and the insertion space for an object is kept wider, the second layer (i.e., the RF shield) and the third layer (i.e., the local RF coil) should be thinner than the above-described structure.

In order to solve the above-described problem, the inventor has worked out innovative structure in which a resonance circuit of the local RF coil is wired so as to extend from the inside of the local gradient coil layer to the outside of the local gradient coil layer. In other words, the second layer of the RF shield is omitted, and wiring of the resonance circuit of the local RF coil is folded back at one end side of the local gradient coil so as to extend from the inside of the local gradient coil to the outside of the local gradient coil.

In the structure in which a local gradient coil and a local RF coil are integrated with each other in the above-described method, it is not necessary to arrange the entire resonance circuit of the local RF coil inside the local gradient coil but it is enough to arrange only a part (e.g., a half) of the resonance circuit inside the local gradient coil. Thus, insertion space for an object can be widened in this structure.

Hereinafter, embodiments of local coil devices and MRI apparatuses will be described with reference to the accompanying drawings. Note that the same reference numbers are given for identical components in each figure, and duplicate explanation is omitted.

First Embodiment

FIG. 1 is a block diagram showing an example of overall configuration of an MRI apparatus 10A of the first embodiment. As an example here, the components of the MRI apparatus 10A will be explained by sorting them into five groups: a bed 20, a gantry 30, a control device 40, a local coil moving device 80, and a local coil device 100A. Note that the local coil device 100A may be interpreted not as a part of the MRI apparatus 10A but as a component independent of the MRI apparatus 10A.

Firstly, the bed 20 includes a supporting platform 21, a table 22, and a table moving system 23 disposed inside the supporting platform 21. An object P is loaded on the top surface of the table 22.

In addition, a headrest 24 configured to support the head of the object P is disposed at one end of the table 22 on the deeper side of the gantry 30. Further, plural connection ports 25 are disposed on the top surface of the table 22. When an RF coil configured to receive MR signals is mounted on the object P aside from the local coil device 100A (like the seventh and eighth embodiments described below), this RF coil is, for example, connected to the MRI apparatus 10A via one of the connection ports 25.

The supporting platform 21 supports the table 22 in such a manner that the table 22 can move in the horizontal direction (i.e., the Z axis direction in the apparatus coordinate system).

As an example here, the X-axis, the Y-axis, and the Z-axis of the apparatus coordinate system are defined as follows. First, the Y-axis direction is defined as the vertical direction, and the table 22 is disposed in such a position that the direction of the normal line of its top surface becomes equal to the Y-axis direction. The horizontal moving direction of the table 22 is defined as the Z-axis direction. The gantry 30 described below is in the form of a cylinder as an example here and is installed in such a manner that its axis direction becomes equal to the Z-axis direction. The X-axis direction is the direction perpendicular to these Y-axis direction and Z-axis direction, and is the width direction of the table 22 in the example of FIG. 1. In the present specification, the X-axis, the Y-axis, and the Z-axis are assumed to be those of the apparatus coordinate system unless otherwise specifically noted.

The table moving system 23 adjusts the position of the table 22 in the vertical direction by adjusting the height of the supporting platform 21, when the table 22 is positioned outside the gantry 30. In addition, the table moving system 23 inserts the table 22 into inside of the gantry 30 by moving the table 22 in the horizontal direction and moves the table 22 to outside of the gantry 30 after completion of imaging.

Secondly, the local coil device 100A is equipped with three functions of applying gradient magnetic fields to a localized region in the imaging space, applying RF pulses to a localized region in the imaging space, and receiving MR signals. As an example here, the local coil device 100A is a birdcage type and is configured to image the head of the object P placed on the headrest 24. Note that the local coil device 100A can image feet of the object P, when the object P is reversely mounted on the table 22 in the body axis direction and feet of the object P are mounted on headrest 24. Detailed structure of this local coil device 100A will be described below by reference to FIG. 2 to FIG. 11.

Thirdly, the local coil moving device 80 includes a supporting platform 81, a plate-shaped insertion board 82, and a local coil moving system 83 disposed inside the supporting platform 81.

On the top surface of the insertion board 82, the local coil device 100A is detachably fixed on the side of the gantry 30. The local coil device 100A is connected to a non-illustrated connection port of the insertion board 82 via a cable so as to be electrically connected to a gradient coil power supply 46, an RF transmitter 48, and an RF receiver 50 of the control device 40 as described below via the insertion board 82.

The supporting platform 81 is disposed to the opposite side of the supporting platform 21 of the bed 20, with the gantry 30 interposed therebetween. The supporting platform 81 supports the insertion board 82 so that the insertion board 82 can move in the Z-axis direction.

The local coil moving system 83 inserts the insertion board 82 into inside of the gantry 30 by horizontally moving the insertion board 82 from the opposite side of the table 22 so that the head of the object P is positioned inside the local coil device 100A. The local coil moving system 83 moves the insertion board 82 back to its reference position on the supporting platform 81 outside the gantry 30 after completion of imaging.

Fourthly, the gantry 30 is shaped in the form of a cylinder, for example. The gantry 30 includes a static magnetic field magnet 31, a shim coil 32, a gradient coil 33, and an RF coil 34.

The static magnetic field magnet 31 is, for example, a superconductivity coil and shaped in the form of a cylinder. The static magnetic field magnet 31 forms a static magnetic field in an imaging space by using electric current supplied from a static magnetic field power supply 42 of the control device 40 described below. Note that the static magnetic field power supply 42 may be omitted by configuring the static magnetic field magnet 31 as a permanent magnet.

The shim coil 32 is shaped, for example, in the form of a cylinder, and is arranged inside the static magnetic field magnet 31 so as to become coaxial with the static magnetic field magnet 31. The shim coil 32 forms an offset magnetic field which uniforms the static magnetic field by using electric current supplied from a shim coil power supply 44 of the control device 40 described below.

The gradient coil 33 is shaped, for example, in the form of a cylinder, and is arranged inside the shim coil 32. The gradient coil 33 includes a non-illustrated X-axis gradient coil, a non-illustrated Y-axis gradient coil, and a non-illustrated Z-axis gradient coil.

The above-described X-axis gradient coil forms a gradient magnetic field Gx in the X-axis direction in an imaging region according to electric current supplied from the gradient coil power supply 46 described below. Similarly, the Y-axis gradient coil forms a gradient magnetic field Gy in the Y-axis direction in an imaging region according to electric current supplied from the gradient coil power supply 46. Similarly, the Z-axis gradient coil forms a gradient magnetic field Gz in the Z-axis direction in an imaging region according to electric current supplied from the gradient coil power supply 46.

Directions of a gradient magnetic field Gss in a slice selection direction, a gradient magnetic field Gpe in a phase encoding direction, and a gradient magnetic field Gro in a readout (i.e., frequency encoding) direction can be arbitrarily selected as logical axes, by combining the gradient magnetic fields Gx, Gy, and Gz in the X-axis, the Y-axis, and the Z-axis directions as three physical axes of the apparatus coordinate system.

The above-described imaging region means, for example, at least a part of an acquisition range of MR signals used to generate one image or one set of images, which becomes an image. The imaging region is, for example, three-dimensionally defined as a part of the imaging space by the apparatus coordinate system. For example, when MR signals are acquired in a range wider than a region made into an image in order to prevent aliasing, the imaging region is a part of the acquisition range of MR signals. On the other hand, in some cases, the entire acquisition range of MR signals becomes an image, i.e., the imaging region matches the acquisition range of MR signals. In addition, the above-described one set of images means, for example, plural images when MR signals of the plural images are collectively acquired in one pulse sequence such as multi-slice imaging.

The RF coil 34 is, for example, a whole-body RF coil shaped in the form of a cylinder and arranged inside the gradient coil 33. The RF coil 34 implements a function of applying RF pulses and a function of receiving MR signals.

When the local coil device 100A is used in imaging, the gradient coil 33 and the RF coil 34 in the gantry 30 do not operate and the local coil device 100A performs application of the gradient magnetic fields Gx, Gy, and Gz, application of RF pulses, and reception of MR signals.

In addition, when a mountable RF coil is used in addition to the local coil device 100A, while application of the gradient magnetic fields Gx, Gy, and Gz and application of RF pulses are performed by the local coil device 100A, reception of MR signals is performed by this mountable RF coil as described below in the seventh and eighth embodiments.

Fifthly, the control device 40 includes the static magnetic field power supply 42, the shim coil power supply 44, the gradient coil power supply 46, the RF transmitter 48, the RF receiver 50, a sequence controller 58, processing circuitry 60, an input device 72, a display 74, and memory circuitry 76.

The gradient coil power supply 46 includes at least three power supplies independent of each other for generation of respective gradient magnetic fields Gx, Gy, and Gz.

When the local coil device 100A is not used, the gradient coil power supply 46 supplies the X-axis gradient coil, the Y-axis gradient coil, and the Z-axis gradient coil of the gradient coil 33 with respective electric currents for generating the gradient magnetic fields Gx, Gy, and Gz.

When the local coil device 100A is used, the gradient coil power supply 46 supplies an X-axis local gradient coil 110x, a Y-axis local gradient coil 110y, and a Z-axis local gradient coil 110z inside the local coil device 100A with respective electric currents for generating the gradient magnetic fields Gx, Gy, and Gz (the above X-axis, Y-axis, and Z-axis local gradient coils 110x, 110y, and 110z will be described below in FIG. 4 to FIG. 7).

The RF transmitter 48 generates RF pulse electric currents of the Larmor frequency for causing nuclear magnetic resonance according to control information inputted from the sequence controller 58. When the local coil device 100A is not used, the RF transmitter 48 outputs the above RF pulse electric currents to the RF coil 34 (i.e., the whole-body coil), and the RF coil 34 applies RF pulses in accordance with these RF pulse electric currents to the object P.

When the local coil device 100A is used, the RF transmitter 48 outputs the above RF pulse electric currents to a local RF coil 130a (FIG. 8) inside the local coil device 100A as described below. The local RF coil 130a applies RF pulses in accordance with these RF pulse electric currents to the object P.

The local RF coil 130a inside the local coil device 100A, the RF coil 34, and/or a mountable RF coil to be mounted on the object receive MR signals generated due to excited nuclear spin inside the object P by the RF pulses, and the received MR signals are inputted to the RF receiver 50.

The RF receiver 50 generates raw data which are digitized complex number data of MR signals obtained by performing predetermined signal processing on the received MR signals and then performing A/D (analog to digital) conversion on the MR signals. The RF receiver 50 outputs the generated raw data of MR signals to the processing circuitry 60 via the sequence controller 58.

The sequence controller 58 stores control information needed for driving the gradient coil power supply 46, the RF transmitter 48, and the RF receiver 50 according to commands inputted from the processing circuitry 60. The above-described control information includes, for example, sequence information describing operation control information such as each intensity, each application period, and each application timing of the pulse electric currents which should be applied to the gradient coil power supply 46.

The sequence controller 58 generates the gradient magnetic fields Gx, Gy and Gz and RF pulses by driving the gradient coil power supply 46, the RF transmitter 48, and the RF receiver 50 according to a predetermined sequence stored therein.

The sequence controller 58 may be configured as special-purpose hardware. Additionally or alternatively, the sequence controller 58 may include a processor which implements each of the above-described functions by software processing.

The processing circuitry 60 may also be configured as special-purpose hardware or include a processor which implements various types of functions by software processing. Hereinafter, an example in which the processing circuitry 60 implements various types of functions by software processing of the processor will be described.

Specifically, as shown in FIG. 1, the processing circuitry 60 implements a system control function 61, an image reconstruction function 62, and an image processing function 64 by executing programs stored in the memory circuitry 76 or programs directly stored in the processor of the processing circuitry 60.

The above-described term "processor" means, for instance, a circuit such as a CPU (Central Processing Unit), a GPU (Graphics Processing Unit), an ASIC (Application Specific Integrated Circuit), a programmable logic device including an SPLD (Simple Programmable Logic Device) and a CPLD (Complex Programmable Logic Device) as examples, and an FPGA (Field Programmable Gate Array).

The number of processors included in the processing circuitry 60 may be one, two, or more. Similarly, the number of processors included in the sequence controller 58 may be one, two, or more.

The system control function 61 of the processing circuitry 60 implements system control of the entirety of the MRI apparatus 10A in setting of imaging conditions of a main scan, an imaging operation, and image display after imaging through interconnection such as a system bus SB.

Information on which of the gradient coil 33 or the local coil device 100A applies gradient magnetic fields Gx, Gy, and Gz and information on which of the local coil device 100A or the RF coil 34 applies RF pulses are included in the imaging conditions.

The above-described imaging conditions refer to under what condition RF pulses and gradient magnetic field pulses are applied in what type of pulse sequence, or under what condition MR signals are acquired from the object P, for example. As parameters of the imaging conditions, for example, there are an imaging region as positional information in the imaging space, a flip angle, a repetition time TR, number of slices, an imaging part, and a type of pulse sequence such as spin echo and parallel imaging. The above imaging part means an anatomical region of the object P to be imaged, such as the head, the chest, and the abdomen.

The above-described main scan is a scan for acquiring an intended diagnosis image such as a T1 weighted image, and it does not include a scan for acquiring MR signals for a scout image or a tuning scan. A scan is an operation of acquiring MR signals, and it does not include image reconstruction processing.

The above-described tuning scan is, for example, a scan for determining unconfirmed elements of imaging conditions, conditions and data used for image reconstruction processing and correction processing after the image reconstruction, and the tuning scan is performed separately from the main scan. As an example of a tuning scan, there is a sequence of calculating the center frequency of the RF pulses used in the main scan. A prescan is a tuning scan which is performed before the main scan.

In addition, the system control function 61 causes the display 74 to display screen information for setting imaging conditions. Then, the system control function 61 sets the imaging conditions based on command information inputted from the input device 72, and outputs the determined imaging conditions to the sequence controller 58. Moreover, the system control function 61 causes the display 74 to display images indicated by the generated display image data after completion of imaging.

The input device 72 includes input tools such as a mouse and a keyboard and provides a user with a function to set imaging conditions and image processing conditions.

The image reconstruction function 62 of the processing circuitry 60 arranges and stores the raw data of MR signals inputted from the RF receiver 50 as k-space data, according to the phase encode step number and the frequency encode step number. The above-described k-space means a frequency space. The image reconstruction function 62 generates image data of the object P by performing image reconstruction processing including two-dimensional or three-dimensional Fourier transform on the k-space data. The image reconstruction function 62 outputs the generated image data to the image processing function 64 and stores the generated image data in the memory circuitry 76.

The image processing function 64 acquires the reconstructed image data from the memory circuitry 76, performs predetermined image processing on the reconstructed image data, and stores the image data subjected to the image processing in the memory circuitry 76 as display image data.

The memory circuit 76 stores the display image data after adding accompanying information such as the imaging conditions used for generating the display image data and information of the object P (i.e., patient information) to the display image data.

Incidentally, the four components including the processing circuitry 60, the input device 72, the display 74, and the memory circuitry 76 may be configured as one computer and installed in a control room, for example.

Although the components of the MRI apparatus 10A are sorted into five groups including the gantry 30, the bed 20, the local coil device 100A, the local coil moving device 80, and the control device 40 in the above description, this is only an example of interpretation. For example, the table moving system 23 may be interpreted as a part of the control device 40. Similarly, the local coil moving system 83 may be interpreted as a part of the control device 40, for example.

Additionally or alternatively, the RF receiver 50 may be configured not as a component of the control device 40 disposed outside the gantry 30 but as a component of the gantry 30 disposed inside the gantry 30. In this case, for example, an electronic circuit board equivalent to the RF receiver 50 may be disposed in the gantry 30. Then, the MR signals which are analogue electrical signals converted from electromagnetic waves by the local coil device 100A, the RF coil 34, or a mountable RF coil may be amplified by a pre-amplifier in the electronic circuit board, then the amplified signals may be outputted to the outside of the gantry 30 as digital signals and inputted to the image reconstruction unit 62 of the processing circuitry 60. For outputting the signals to the outside of the gantry 30, for example, an optical communication cable is preferably used to transmit the signals in the form of optical digital signals. This is because the effect of external noise is reduced.

Figure 2:
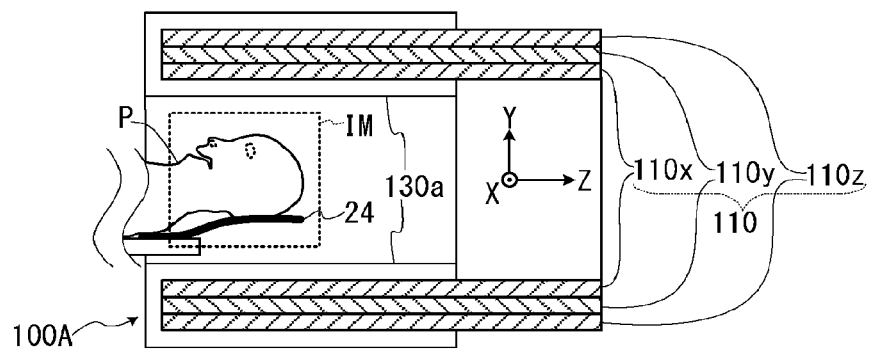
FIG. 2 is a schematic cross-sectional diagram of a Y-Z plane illustrating an example of overall structure of the local coil device of the first embodiment.

FIG. 2 is a schematic cross-sectional diagram of a Y-Z plane illustrating an example of overall structure of the local coil device 100A of the first embodiment. As shown in FIG. 2, the local coil device 100A includes a main local gradient coil 110 and a local RF coil 130a. Since a priority is given to a large insertion space for an object in the first embodiment, structure in which a shield local gradient coil is omitted will be described as an example.

The main local gradient coil 110 is cylindrical as an example here, and includes the X-axis local gradient coil 110x arranged as the innermost layer, the Y-axis local gradient coil 110y arranged as the intermediate layer, and the Z-axis local gradient coil 110z arranged as the outermost layer.

The local RF coil 130a of birdcage type is arranged so as to extend from further inner side of the X-axis local gradient coil 110x to the outer side of the Z-axis local gradient coil 110z. In other words, the wiring of the local RF coil 130a is folded back at the entrance side of the local coil device 100A. In addition, the length of the local RF coil 130a in the Z-axis direction is shorter than that of the local gradient coil 110.

The object P is inserted from one side of the hollow region of the local coil device 100A (i.e., from the side where the wiring of the local RF coil 130a is folded back). Accordingly, the region used as an imaging region IM inside the local coil device 100A is not the central region of the hollow region of the local coil device 100A but the region on the entrance side of the hollow region (i.e., the side closer to the position where the wiring of the local RF coil 130a is folded back).

Figure 3:
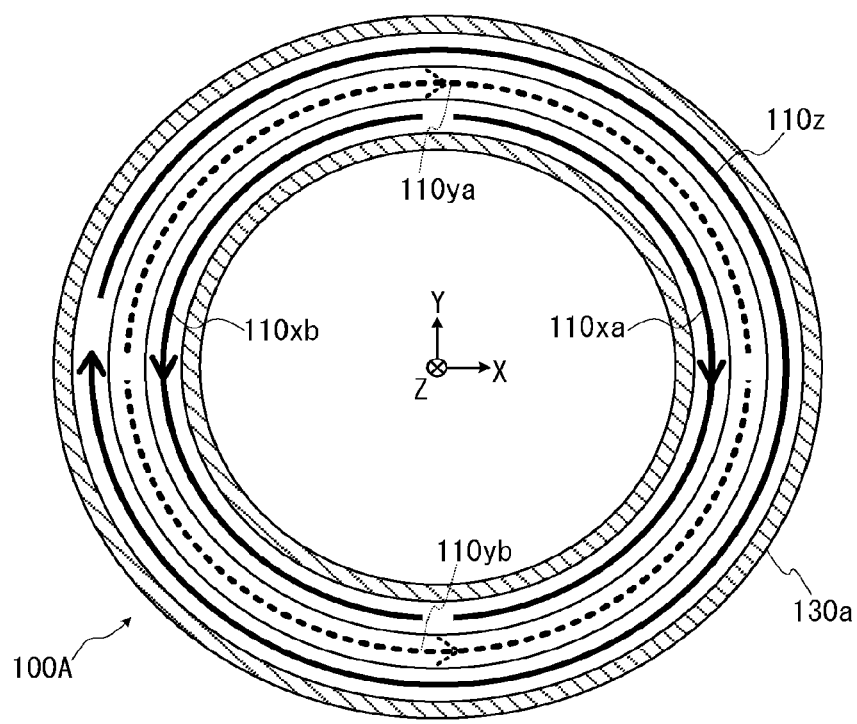
FIG. 3 is a schematic cross-sectional diagram of an X-Y plane illustrating an example of overall structure of the local coil device of the first embodiment.

FIG. 3 is a schematic cross-sectional diagram of an X-Y plane illustrating an example of overall structure of the local coil device 100A of the first embodiment. In FIG. 3, the local RF coil 130a corresponds to the outermost annular hatched region and the innermost annular hatched region.

The X-axis local gradient coil 110x includes a first X-axis coil 110xa and a second X-axis coil 110xb. The first X-axis coil 110xa and the second X-axis coil 110xb are arranged so as to be symmetrical about a Y-Z plane. As an example here, electric current flows downward in the vertical (i.e., the Y-axis) direction in the first X-axis coil 110xa and the second X-axis coil 110xb as shown by the bold arrows in FIG. 3.

The Y-axis local gradient coil 110y includes a first Y-axis coil 110ya and a second Y-axis coil 110yb. The first Y-axis coil 110ya and the second Y-axis coil 110yb are arranged so as to be symmetrical about an X-Z plane. As an example here, electric current flows from the positive side to the negative side in the X-axis direction in the first Y-axis coil 110ya and the second Y-axis coil 110yb as shown by the broken-line arrows.

The X-axis local gradient coil 110x, the Y-axis local gradient coil 110y, and the Z-axis local gradient coil 110z respectively apply the gradient magnetic fields Gx, Gy, Gz to the imaging region IM in accordance with respective electric currents supplied separately from the gradient coil power supply 46.

Although the X-axis local gradient coil 110x is arranged innermost, the Z-axis local gradient coil 110z is arranged outermost, and the Y-axis local gradient coil 110y is arranged between the X-axis local gradient coil 110x and the Z-axis local gradient coil 110z in the case of FIG. 2 and FIG. 3, this is only an example. Out of these three local gradient coils 110x, 110y, and 110z, any one may be arranged outermost and any one may be arranged innermost.

Figure 4:
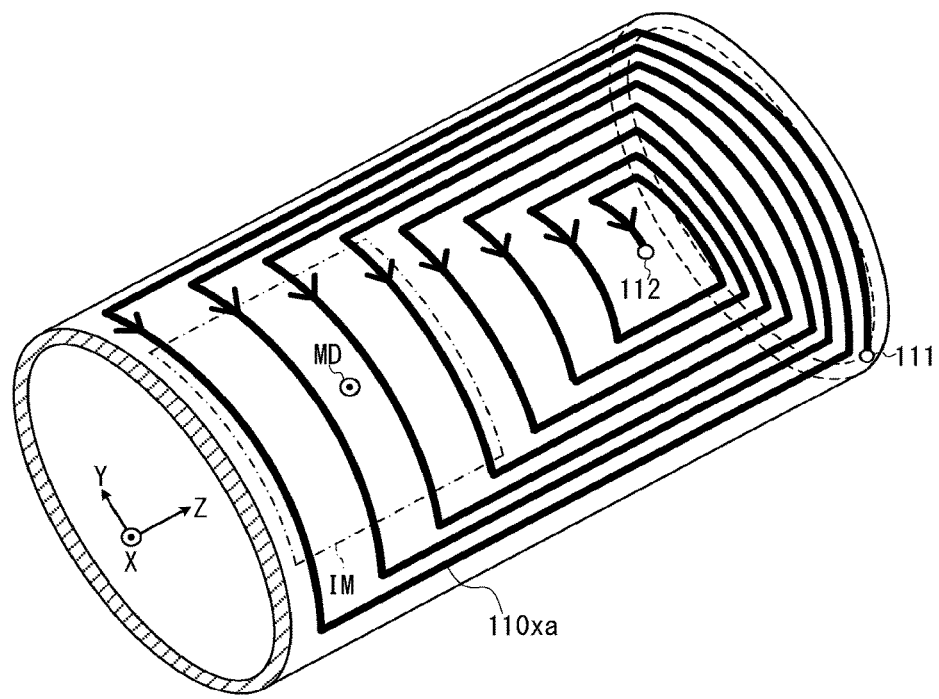
FIG. 4 is a schematic perspective view illustrating an example of the wiring of the first X-axis coil 110xa shown in FIG. 3.

FIG. 4 is a schematic perspective view illustrating an example of the wiring of the first X-axis coil 110xa shown in FIG.

Figure 5:
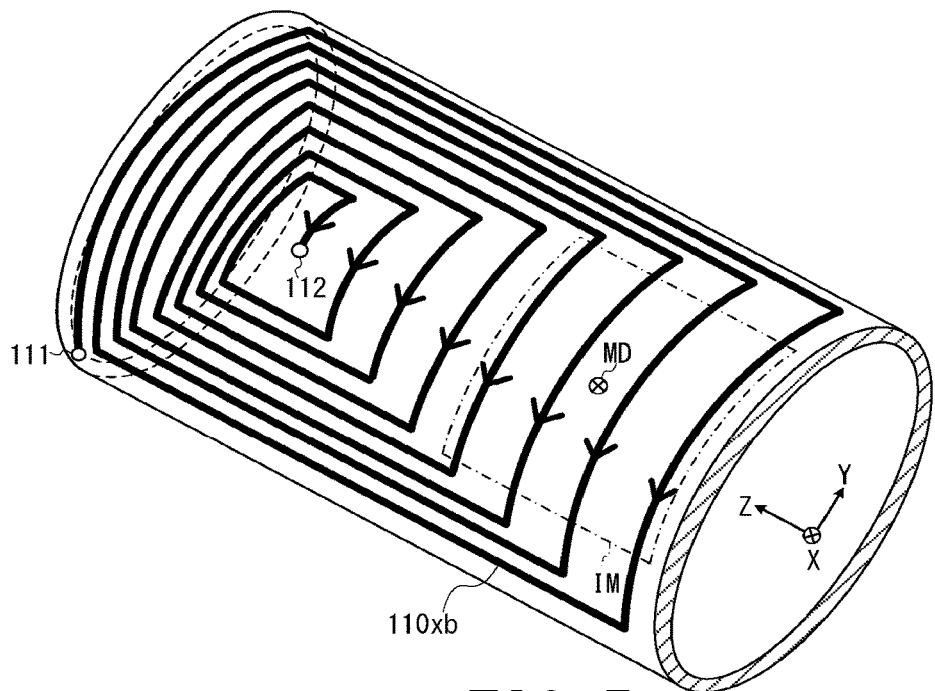
FIG. 5 is a schematic perspective view illustrating an example of the wiring of the second X-axis coil 110xb shown in FIG. 3.

FIG. 5 is a schematic perspective view illustrating an example of the wiring of the second X-axis coil 110xb shown in FIG. 3.

It is assumed that the direction substantially perpendicular to the paper surface of each of FIG. 4 and FIG. 5 is the X-axis direction. Hereinafter, structure of the X-axis local gradient coil 110x will be described by reference to FIG. 4 and FIG. 5.

As shown in FIG. 4 and FIG. 5, each of the first X-axis coil 110xa and the second X-axis coil 110xb shows spiral wiring, and both are arranged so as to be symmetrical about a Y-Z plane and generate gradient magnetic field Gx having a gradient in the X-axis direction. The wiring of each of the first and second X-axis coils 110xa and 110xb is asymmetrical about the Z-axis direction. That is, the closer to the entrance side of the local coil device 100A, the wider the interval of the wiring of each of the first and second X-axis coils 110xa and 110xb in the Z-axis direction becomes. The above entrance side means one of the two annular end planes of the cylindrical structure of the local coil device 100A, from which the object P is inserted.

A starting point (terminal) 111 and an ending point (terminal) 112 of the first X-axis coil 110xa are connected to the gradient coil power supply 46. Similarly, the starting point (terminal) 111 and an ending point (terminal) 112 of the second X-axis coil 110xb are connected to the gradient coil power supply 46.

Although other components such as the table 22 and the headrest 24 are not illustrated in FIG. 4 and FIG. 5 for avoiding complication, the width of the headrest 24 in the X-axis direction is narrower than the width of the table 22 in the X-axis direction and is narrower than the width (i.e., diameter) of the hollow region of the local coil device 100A.

Here, the local RF coil 130a generates an RF magnetic field which rotates in an X-Y plane, and thus, the RF magnetic flux direction MD illustrated in each of FIG. 4 and FIG. 5 is an example of an RF magnetic field generated by the local RF coil 130a. Hereinafter, the coupling effect between the local RF coil 130a and the X-axis local gradient coil 110x will be described by reference to the RF magnetic flux direction MD shown in each of FIG. 4 and FIG. 5.

On the right side of the RF magnetic flux direction MD in FIG. 4, electric current flows downward in the vertical direction in the first X-axis coil 110xa. On the left side of the RF magnetic flux direction MD in FIG. 4, electric current also flows downward in the vertical direction in the first X-axis coil 110xa. This point is also clear from FIG. 3.

Thus, as to the first X-axis coil 110xa, electric current flows in the same direction on both sides of the RF magnetic flux direction MD, which makes it difficult to generate a loop of electric current around the RF magnetic flux direction MD. Accordingly, the coupling effect between the first X-axis coil 110xa and the local RF coil 130a is hardly caused.

For the reason similar to above, the coupling effect between the second X-axis coil 110xb and the local RF coil 130a is hardly caused. Thus, the coupling effect between the local RF coil 130a and the X-axis local gradient coil 110x is hardly caused.

Figure 6:
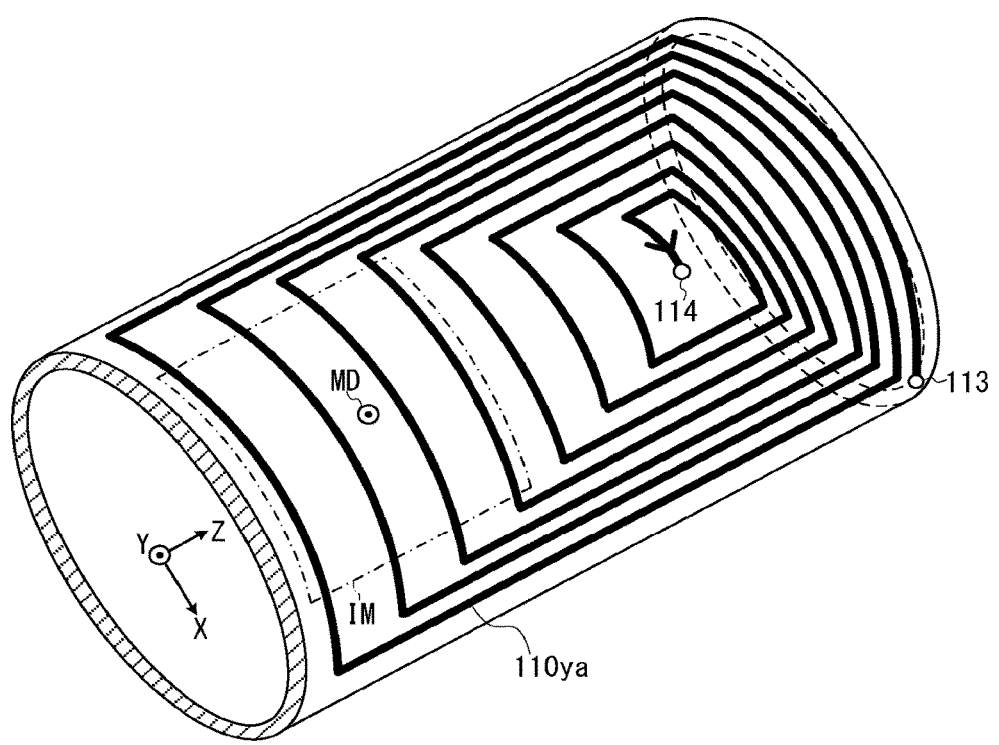
FIG. 6 is a schematic perspective view illustrating an example of the wiring of the first Y-axis coil 110ya shown in FIG. 3.

FIG. 6 is a schematic perspective view illustrating an example of the wiring of the first Y-axis coil 110ya shown in FIG. 3. The first Y-axis coil 110ya also shows spiral wiring like the first and second X-axis coils 110xa and 110xb. That is, the closer to the entrance side (i.e., one of the two annular end planes of the cylindrical structure, from which the object P is inserted) of the local coil device 100A, the wider the interval of the wiring of the first Y-axis coil 110ya in the Z-axis direction becomes.

Since the wiring of the second Y-axis coil 110yb shown in FIG. 3 is similar to the wiring of the first Y-axis coil 110ya, a duplicate drawing is omitted. These first and second Y-axis coils 110ya and 110yb are arranged so as to be symmetrical about an X-Z plane (FIG. 3) and generate the gradient magnetic field Gy having a gradient in the Y-axis direction.

A starting point 113 and an ending point 114 of the wiring of the first Y-axis coil 110ya are connected to the gradient coil power supply 46 via non-illustrated cables. Similarly, the starting point 113 and the ending point 114 of the wiring of the second Y-axis coil 110yb are connected to the gradient coil power supply 46 via non-illustrated cables. Further, the coupling effect between the Y-axis local gradient coil 110y and the local RF coil 130a is hardly caused for the same reason as the X-axis local gradient coil 110x described with FIG. 4 and FIG. 5.

Figure 7:
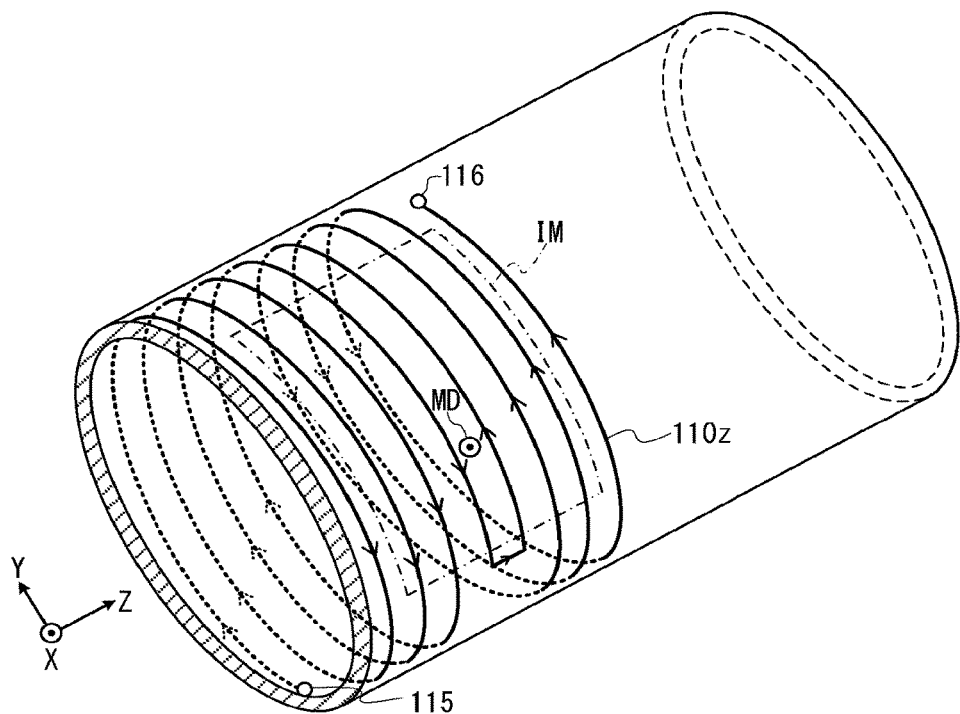
FIG. 7 is a schematic perspective view illustrating an example of the wiring of the Z-axis local gradient coil 110z shown in FIG. 3.

FIG. 7 is a schematic perspective view illustrating an example of the wiring of the Z-axis local gradient coil 110z shown in FIG. 3. As an example in FIG. 7, it is assumed that the direction perpendicular to the paper surface of FIG. 7 is the X-axis direction, the wiring of the Z-axis local gradient coil 110z on the front side in the X-axis direction is indicated by a solid line, and the wiring of the Z-axis local gradient coil 110z on the back side in the X-axis direction is indicated by a broken line. In addition, the chain-line frame in FIG. 7 is an example of the imaging region IM.

As shown in FIG. 7, the winding direction of the wiring of the Z-axis local gradient coil 110z is folded back substantially at the center of its wiring length. Thus, when the flow of electric current in the Z-axis local gradient coil 110z is observed from the left side of FIG. 7, electric current flows clockwise on the side closer to entrance side than the midst of the wiring length, and flows counterclockwise on the side farther than the midst of the wiring length. However, this is only an example and electric current may flow counterclockwise on the entrance side and flow clockwise on the farther side. By wiring the Z-axis local gradient coil 110z in this manner, the gradient magnetic field Gz having a gradient in the axial direction of the cylindrical structure of the main local gradient coil 110 is generated in the imaging region IM.

Focusing on the midst of the wiring length of the Z-axis local gradient coil 110z (i.e., the turn-around point of electric current direction), directions of the electric current flowing in the Z-axis local gradient coil 110z indicated by the solid line on both sides of the RF magnetic flux direction MD shown in FIG. 7 are opposite to each other. In other words, a loop of electric current which may become a factor of the coupling effect is likely to be caused around the RF magnetic flux direction MD.

However, on the opposite side in the diametrical direction of the cylindrical structure of the main local gradient coil 110, the circular direction of the electric-current-loop generated around the RF magnetic flux direction MD by the wiring of the Z-axis local gradient coil 110z indicated by the broken line is opposite to the circular direction of the electric-current-loop generated by the above-described wiring indicated by the solid line. The electric-current-loop generated on one side in the diametrical direction of the cylindrical structure of the main local gradient coil 110 is canceled by the electric-current-loop generated on the opposite side in the diametrical direction of the cylindrical structure, because both are opposite to each other in terms of the direction of circularly flowing electric current. For the above reason, the coupling effect between the local RF coil 130a and the Z-axis local gradient coil 110z is hardly caused.

Figure 8:
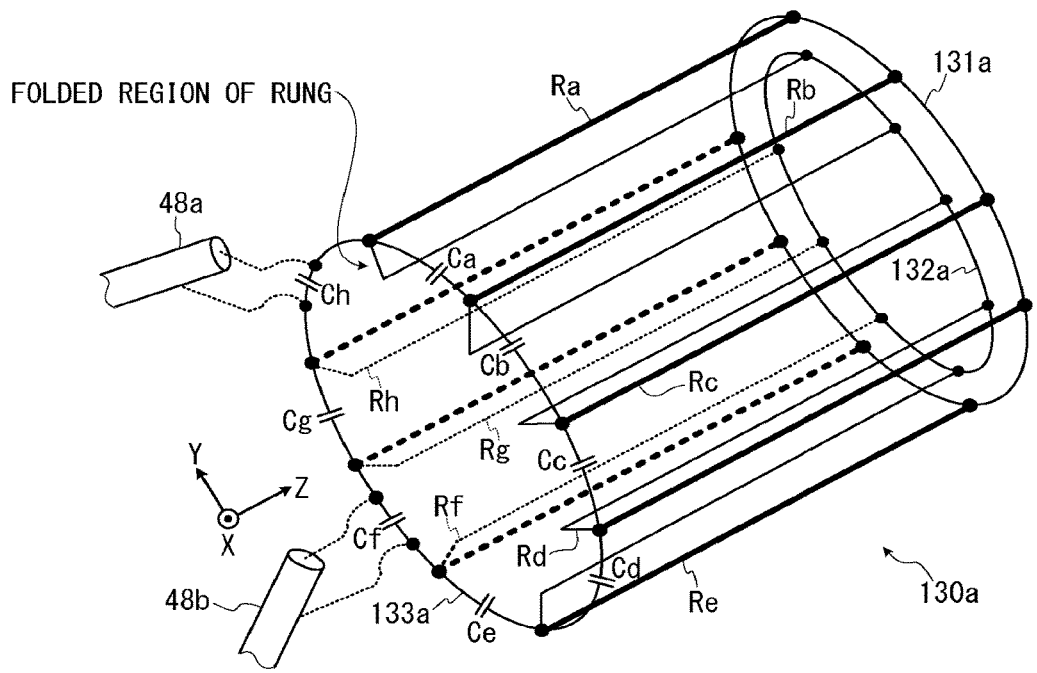
FIG. 8 is a schematic perspective view illustrating an example of an equivalent circuit of the local RF coil of the local coil device in the first embodiment.

FIG. 8 is a schematic perspective view illustrating an example of the equivalent circuit of the local RF coil 130a of the local coil device 100A in the first embodiment. As an example here, it is assumed that the direction substantially perpendicular to the paper surface of FIG. 8 is the X-axis direction.

As shown in FIG. 8, the local RF coil 130a includes a first loop conductor 131a, a second loop conductor 132a, a third loop conductor 133a, eight connecting conductors (i.e., rungs) Ra, Rb, Rc, Rd, Re, Rf, Rg, and Rh, and eight resonance capacitors Ca, Cb, Cc, Cd, Ce, Cf, Cg, and Ch.

Out of the two concentric annular wires in parallel with an X-Y plane indicated on the right side of FIG. 8, the outer annular wire is the first loop conductor 131a and the inner annular wire is the second loop conductor 132a. On the left side of FIG. 8, the annular wire in parallel with an X-Y plane is the third loop conductor 133a. Out of all the intersection points between the respective connecting conductors Ra to Rh and the first to third loop conductors 131a to 133a in FIG. 8, the intersection points indicated by blackly filled circles are connection nodes and the remaining intersection points are not connection nodes (i.e., not electrically connected).

In FIG. 8, each of the connecting conductors Ra to Rh is configured of two straight wires extending along the Z-axis direction and one straight wire in parallel with an X-Y plane connecting these two straight wires extending along the Z-axis direction. For distinction in FIG. 8, the connecting conductors Ra to Re on the front side in the X-axis direction are indicated by solid lines and the connecting conductors Rf to Rh on the back side in the X-axis direction are indicated by broken lines. Further, for distinction in FIG. 8, the straight wire extending along the Z-axis direction on the external diameter side of the entire wiring of each of the connecting conductors Ra to Rh is indicated by a bold line.

The wiring of each of the connecting conductors Ra to Rh is connected to the first loop conductor 131a on its one end, is connected to the third loop conductor 133a on its turn-around point approximately at the midst, and is folded approximately by 90° at this connection node with the third loop conductor 133a. Further, the wiring of each of the connecting conductors Ra to Rh straightly extends in parallel with an X-Y plane from this folded point, is folded again approximately by 90° so as to straightly extend along the Z-axis direction, and is connected to the second loop conductor 132a on its another end. There are eight connection nodes between the third loop conductor 133a and the respective connecting conductors Ra to Rh, and the resonance capacitors Ca to Ch are inserted one-by-one in series between the respective eight connection nodes.

The local RF coil 130a is configured as a resonance circuit resonating at the Larmor frequency by wiring respective circuit elements in the above-described manner. In other words, circuit constants of the above-described circuit elements of the local RF coil 130a are determined so that the resonance frequency of the local RF coil 130a becomes equal to the Larmor frequency. In the present specification, it is assumed that the Larmor frequency means a magnetic resonance frequency.

The above-described circuit constants are, for example, (1) a capacitance value of each of the resonance capacitors Ca to Ch, (2) inductance of each of eight wiring parts of the first loop conductor 131a divided by the eight connection nodes respectively connected with the eight connecting conductors Ra to Rh, (3) inductance of each of eight wiring parts of the second loop conductor 132a divided by the eight connection nodes respectively connected with the eight connecting conductors Ra to Rh, (4) inductance of each of eight wiring parts of the third loop conductor 133a divided by the eight connection nodes respectively connected with the eight connecting conductors Ra to Rh, (5) wiring capacity on the external diameter side of each of the connecting conductors Ra to Rh (the wiring part indicated by a bold straight line in FIG. 8), and (6) wiring capacity on the internal diameter side of each of the connecting conductors Ra to Rh. As an example here, capacitance values of the respective resonance capacitors Ca to Ch are equal to each other.

In addition, as an example here, the local coil device 100A is supplied with electric power via power transmission cables 48a and 48b from the RF transmitter 48 under a QD (Quadrature) method. Thus, when an AC (Alternating Current) RF pulse electric current is supplied to both ends of the resonance capacitor Ch from the power transmission cable 48a, an AC RF pulse electric current whose phase is shifted by 90° from the alternating RF pulse electric current supplied from the power transmission cable 48a is supplied to both ends of the resonance capacitor Cf or Cb.

Incidentally, the local RF coil 130a has a function of receiving MR signals of the Larmor frequency emitted from the object P in addition to a function of applying RF pulses of the Larmor frequency. MR signals received by the local RF coil 130a are inputted to the RF receiver 50 side via non-illustrated wiring.

Figure 9:
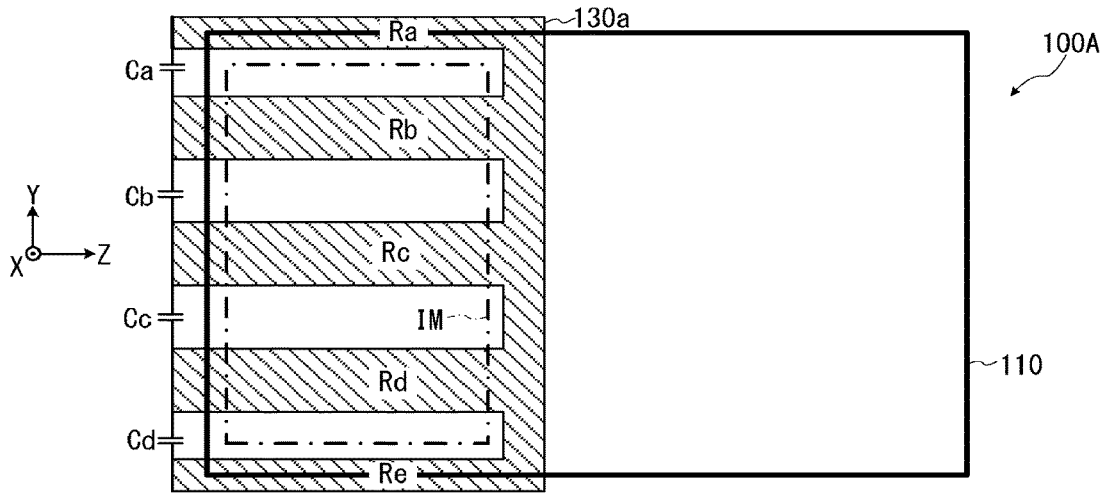
FIG. 9 is a schematic side view illustrating an example of positional relationship between a main local gradient coil and the local RF coil.

FIG. 9 is a schematic side view illustrating an example of positional relationship between the main local gradient coil 110 and the local RF coil 130a. Since FIG. 9 is a side view from one side, the resonance capacitors Ce, Cf, Cg, and Ch and the connecting conductors Rf, Rg, and Rh are not illustrated. However, the resonance capacitors Ca to Ch are circularly arranged on the entrance side of the local coil device 100A so as to be separated from each other at equal distance.

As described above, not the entirety of the hollow region of the local coil device 100A but only a part of (e.g., only a half of) this hollow region on the entrance side becomes the imaging region IM. Thus, power efficiency can be improved by avoiding application of RF pulses to a region separate from the imaging region IM. In this respect, the local RF coil 130a is unevenly arranged to a region on the entrance side of the local coil device 100A. Accordingly, the length of the local RF coil 130a in the Z-axis direction is shorter than the length of the main local gradient coil 110 in the Z-axis direction.

Figure 10:
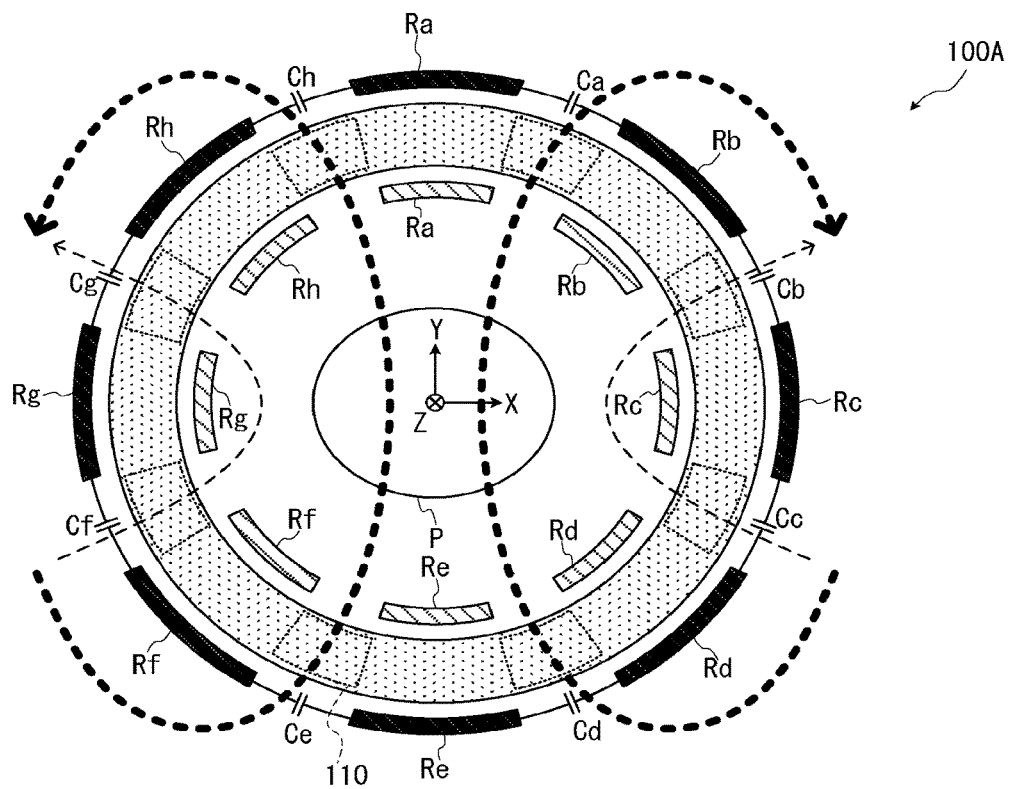
FIG. 10 is a schematic cross-sectional diagram illustrating RF magnetic fields caused by the local RF coil on a cross-section of an X-Y plane on the entrance side of the local coil device from which an object is inserted.

FIG. 10 is a schematic cross-sectional diagram illustrating RF magnetic fields caused by the local RF coil 130a on a cross-section of an X-Y plane on the entrance side of the local coil device 100A from which an object is inserted.

In FIG. 10, an annular dot-hatched region between two concentric circles indicates the layer of the main local gradient coil 110. As to each of the connecting conductors Ra to Rh, its region outside the main local gradient coil 110 is indicated by a blackly filled region and its region inside the main local gradient coil 110 is indicated by an oblique-line-hatched region. The four broken-line arrows in FIG. 10 are examples of RF magnetic fluxes which rotate on an X-Y plane about the Z-axis.

In terms of efficiently transmitting RF pulses, it is preferable that the amount of RF magnetic fluxes penetrating the main local gradient coil 110 becomes the minimum. In other words, it is desirable that RF magnetic fluxes penetrate only each region between the respective connecting conductors Ra to Rh (i.e., each region surrounded by a thin broken line inside the annular dot-hatched region corresponding to the main local gradient coil 110) as shown in FIG. 10.

In order to achieve this, it is enough to satisfy conditions as follows. As to the connecting conductors Ra, the electric current i1 flowing in the external diameter side (i.e., the blackly filled region) becomes substantially equal to the electric current i2 flowing in the internal diameter side (i.e., the oblique-line-hatched region) in phase and amplitude. As to the other connecting conductors Rb to Rh, the condition is the same as above. As to a method of adjusting wiring for satisfying the above-described conditions, it will be described by reference to the next FIG. 11.

Figure 11:
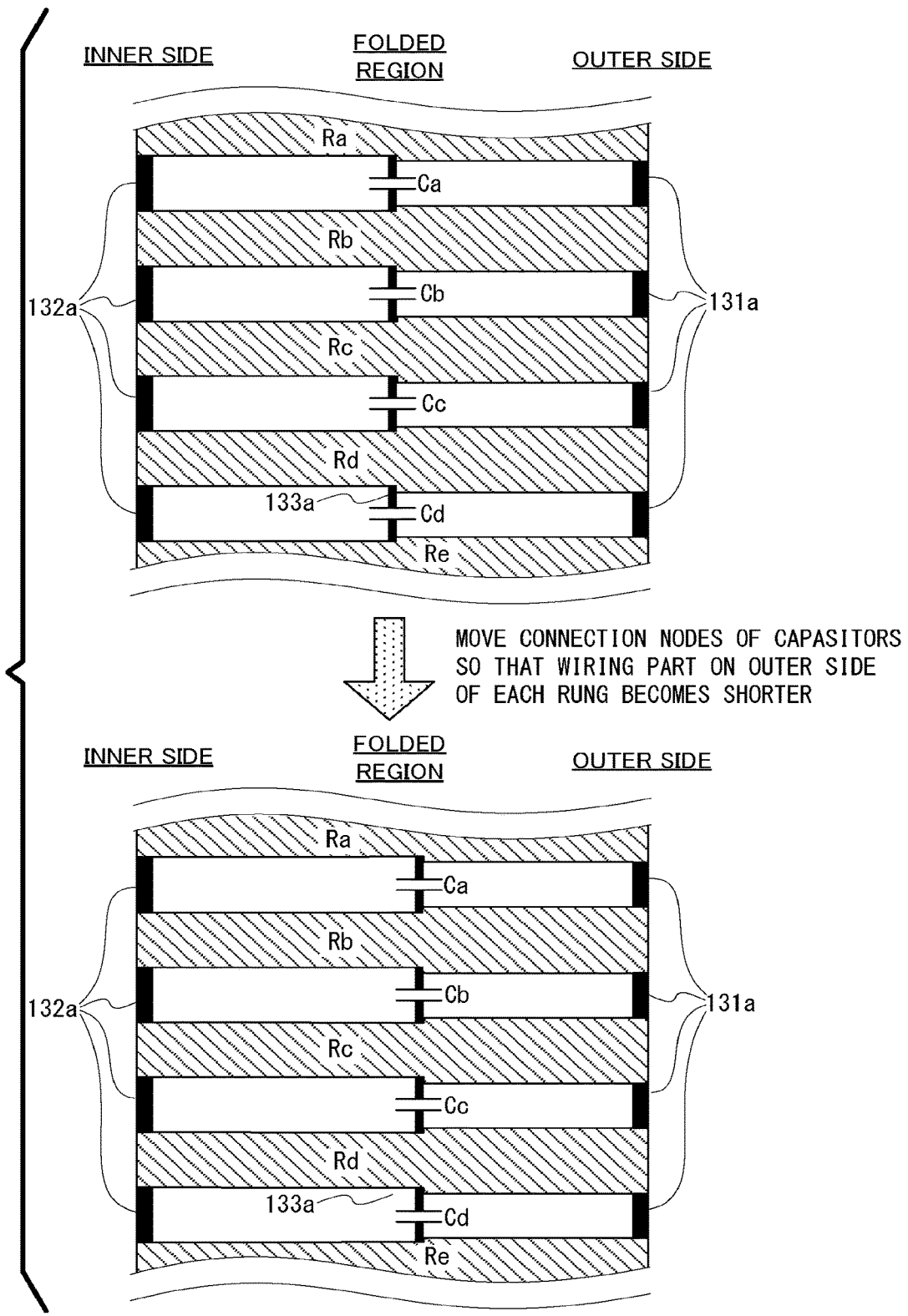
FIG. 11 is a schematic developed circuit diagram of the local RF coil illustrating an example of a method of adjusting connection positions of the resonance capacitors, in order to approximately match the external electric current of each of the connecting conductors with its internal electric current in phase and amplitude.

FIG. 11 is a schematic developed circuit diagram of the local RF coil 130a illustrating an example of a method of adjusting connection positions of the resonance capacitors Ca to Ch, in order to approximately match the external electric current of each of the connecting conductors Ra to Rh with its internal electric current in phase and amplitude. The upper part of FIG. 11 is a schematic circuit diagram before adjustment of connection positions of the resonance capacitors, and the lower part of FIG. 11 is a schematic circuit diagram after adjustment of connection positions of the resonance capacitors.

In the upper part and lower part of FIG. 11, five hatched regions indicate the connecting conductors Ra to Re, the vertical bold line connecting the resonance capacitors Ca to Cd with each other is the third loop conductor 133a, the vertical bold line on the right side is the first loop conductor 131a, and the vertical bold line on the left side is the second loop conductor 132a. In order to avoid complication in FIG.

11, the connecting conductors Rf to Rh and the resonance capacitors Ce to Ch are omitted.

Although the first loop conductor 131a and the second loop conductor 132a are drawn by the same size in FIG. 11 as a developed diagram, the first loop conductor 131a is on the external diameter and is longer than the second loop conductor 132a on the internal diameter side (see FIG. 8). As an example here, the width of each of the connecting conductors Ra to Re is wider on the outer side of the folded region and is narrower on the inner side (see FIG. 10).

Here, it is assumed that the electric current i1 flowing in the outer side is smaller in amplitude than the electric current i2 flowing in the inner side as to each of the respective connecting conductors Ra to Rh in the upper part of FIG. 11 before adjustment. In this case, it is enough to move the connection nodes of the resonance capacitors Ca to Ch to the side which is required to receive supply of more electric current. In other words, it is enough to move the positions of the connection nodes between the connecting conductors Ra to Rh and the resonance capacitors Ca to Ch to the outer side (i.e., to the side of the first loop conductor 131a) as shown in the lower part of FIG. 11. The reason is as follows. As to each of the connecting conductors Ra to Rh, though the total wiring length including the inner and outer sides is not changed, the wiring part on the outer side becomes shorter and the wiring part on the inner side becomes longer. As the result, as to each of the connecting conductors Ra to Rh, its impedance on the outer side reduces by the amount corresponding to the shortened wiring part on the outer side.

Note that the above-described method of adjustment is only an example. As another example, as to each of the connecting conductors Ra to Rh, the electric current i1 flowing in the outer side can be matched in phase and amplitude with the electric current i2 flowing in the inner side by adjusting the width of the conducting body on the outer side and the width of the conducting body on the inner side. This is because impedance reduces by widening the width of the conducting body and amplitude of electric current increases by the amount corresponding to the reduced impedance.

The foregoing is the description of configuration of the local coil device 100A of the first embodiment.

Figure 12:
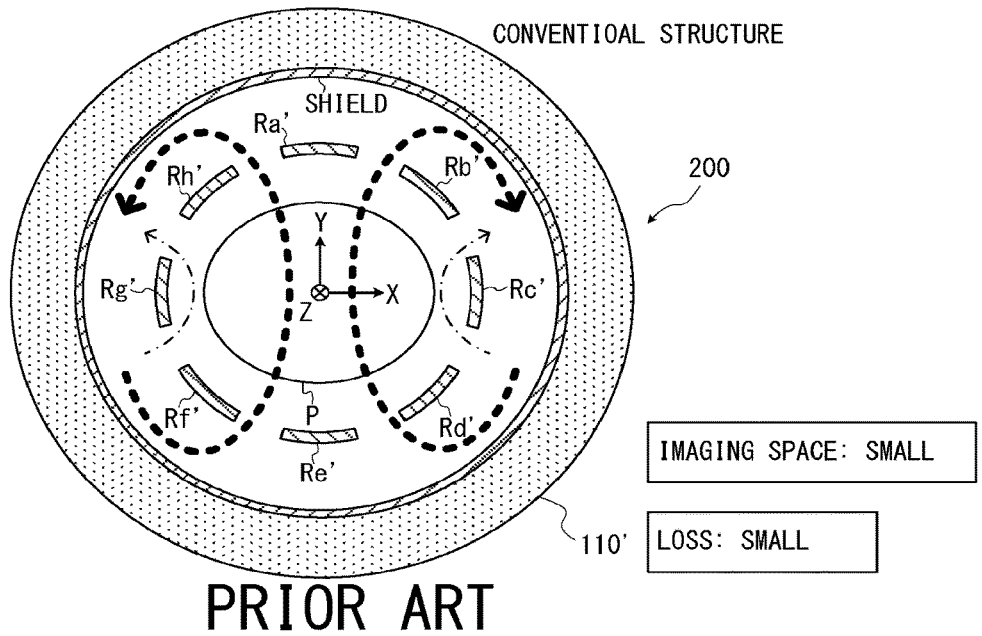
FIG. 12 is a schematic cross-sectional diagram illustrating an example of structure of a conventional local RF coil.

In order to compare the local coil device 100A of the first embodiment with conventional technology, a conventional local coil device 200 is shown in FIG. 12.

FIG. 12 is a schematic cross-sectional diagram illustrating an example of structure of the conventional local RF coil 200.

In the local coil device 200 of conventional structure shown in FIG. 12, the main local gradient coil 110' is arranged outermost and an RF shield made of copper foil as an example is arranged along the inner periphery of the main local gradient coil 110'. Inside the RF shield, a conventional birdcage type local RF coil configured as onefold structure (i.e., unfolded and single-layer structure) and including eight connecting conductors Ra' to Rh' is disposed.

Space having predetermined thickness is formed between the RF shield and the birdcage type local RF coil of this onefold structure. Magnetic fluxes generated by the local RF coil (indicated by two bold broken-line arrows in FIG. 12) penetrate the space inside the local RF coil and the space between the RF shield and the local RF coil, but do not penetrate the main local gradient coil 110'. Thus, loss of magnetic fluxes is small. Instead of this advantage, the structure shown in FIG. 12 is required to reduce the diameter of the local RF coil by the amount corresponding to the space between the RF shield and the local RF coil. As a result, the internal space of the local RF coil, i.e., the imaging space is reduced.

Figure 13:
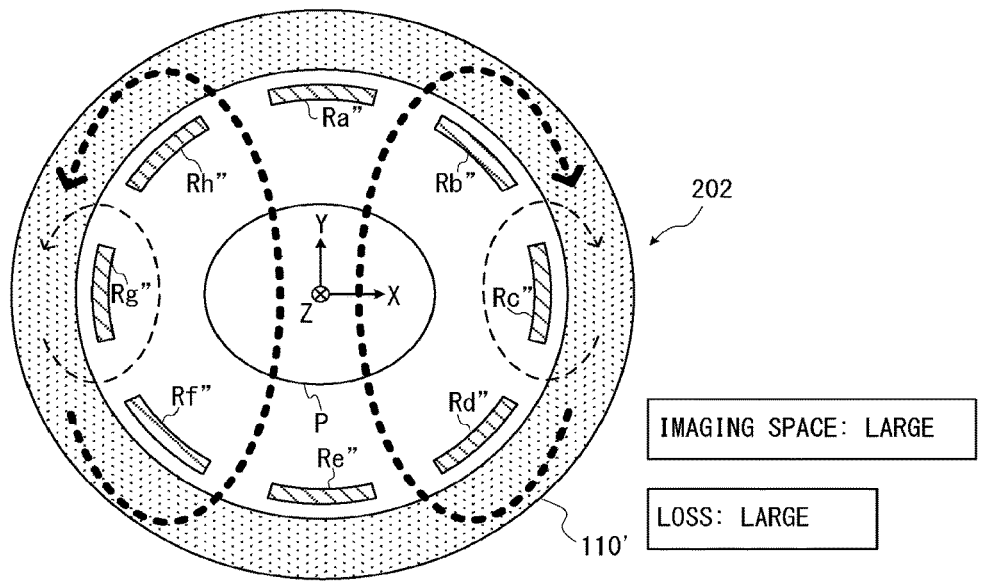
FIG. 13 is a schematic cross-sectional diagram illustrating structure of a local coil device obtained by enlarging the diameter of the local RF coil shown in FIG. 12.

FIG. 13 is a schematic cross-sectional diagram illustrating another structure of a local coil device 201 obtained by enlarging the diameter of the local RF coil 200 shown in FIG. 12. The local coil device 202 includes a birdcage type local RF coil which is configured as onefold structure similar to FIG. 12 and includes eight connecting conductors Ra" to Rh" of one layer. Since the diameter of the local RF coil shown in FIG. 13 is larger than the structure of the local RF coil shown in FIG. 12, the imaging space of the local coil device 202 shown in FIG. 13 becomes larger than that of the local coil device 200 shown in FIG. 12. Meanwhile, when the imaging space is enlarged as shown in FIG. 13, the distance between the RF shield and the outer surface of the local RF coil is shortened. Here, if the RF shield is present, as shown in FIG. 12, a current, which has an opposite direction of a current in the local RF coil, flows in the RF shied, resulting that the intensity of the RF magnetic field in the inner space of the local RF coil is reduced. Thus, RF transmitting efficiency is accordingly reduced. In order to avoid this reduction of the RF transmitting efficiency, local coil device 201 does not include the RF shield, as shown in FIG. 13.

Due to absence of the RF shield, however, magnetic fluxes generated inside the local RF coil in FIG. 13 penetrate inside of the local gradient coil 110', which makes loss of magnetic fluxes larger. As a result, power efficiency of the local RF coil of the local coil device 202 is also reduced.

By contrast, in the case of the local coil device 100A of the first embodiment shown in FIG. 10, it is possible to secure a large space inside the local RF coil 130a (i.e., the imaging space), because the space between the inner surface of the main local gradient coil 110 and the local RF coil is substantially eliminated. At the same time, power efficiency of the local RF coil 130a becomes much higher than the structure shown in FIG. 13, because RF magnetic fluxes penetrate only a limited part of the main local gradient coil 110a, as shown in FIG. 10.

Figure 14:
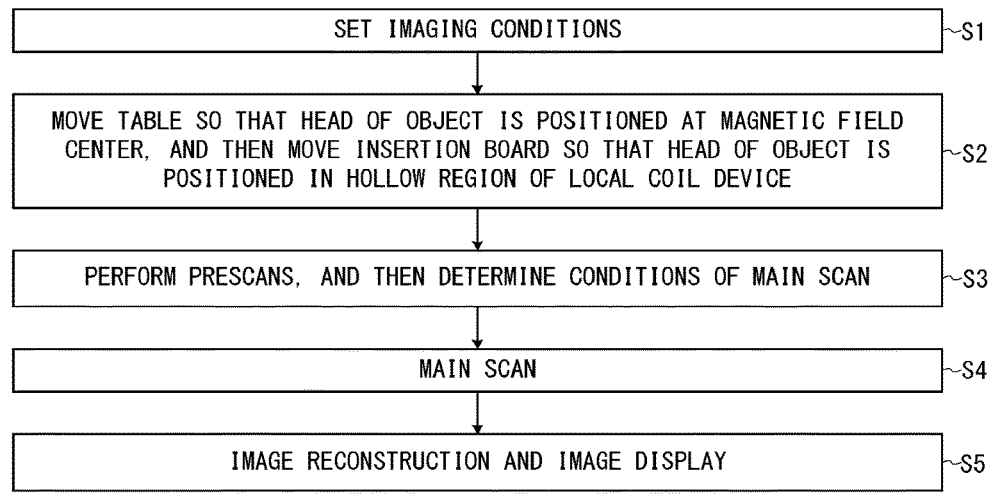
FIG. 14 is a flowchart illustrating an example of a flow of an operation performed by the MRI apparatus of the first embodiment.

FIG. 14 is a flowchart illustrating an example of a flow of an operation performed by the MRI apparatus 10A of the first embodiment. Hereinafter, according to the step numbers in the flowchart shown in FIG. 14, an operation performed by the MRI apparatus 10 will be described by referring to the above-described FIGS. 1 to 13 as required.

[Step S1] The system control function 61 of the processing circuitry 60 (FIG. 1) sets some of imaging conditions of the main scan based on imaging conditions inputted to the MRI apparatus 10A via the input device 72. As an example here, it is assumed that conditions of imaging the head using the local RF coil device 100A for applying RF pulses and receiving MR signals are set.

Afterward, the processing proceeds to the step S2.

[Step S2] The table moving system 23 horizontally moves the table 22 into inside of the gantry 30 according to commands inputted from the sequence controller 58 so that the head of the object P on the headrest 24 is positioned at the magnetic field center. The above-described magnetic field center is, for example, the geometric center position of the gantry 30.

Afterward, the local coil moving system 83 horizontally moves the insertion board 82 into inside of the gantry 30 from the opposite side of the table 22 according to commands inputted from the sequence controller 58 so that the head of the object P is positioned at the entrance side of the hollow region of the local coil device 100A (see FIG. 2).

Afterward, the processing proceeds to the step S3.

[Step S3] Electric current is supplied from the shim coil power supply 44 to the shim coil 32, thereby the static magnetic field formed in the imaging space is uniformed.

The system control function 61 controls each component of the MRI apparatus 10A so that prescans are performed, and sets conditions of the main scan such as the center frequency of RF pulses. In this manner, the system control function 61 determines all the imaging conditions of the main scan based on execution results of the prescans.

Afterward, the processing proceeds to the step S4.

[Step S4] On the basis of the imaging conditions determined in the step S3, data acquisition of the main scan is performed. Since the local coil device 100A is used for the main scan as an example here, the gradient coil 33 and the RF coil 34 in the gantry 30 do not operate.

Specifically, when a command to start imaging is inputted from the input device 72 to the system control function 61, the system control function 61 inputs the imaging conditions including a pulse sequence into the sequence controller 58. The sequence controller 58 drives the gradient coil power supply 46, the RF transmitter 48, and the RF receiver 50 according to the inputted pulse sequence. Thereby, the X-axis local gradient coil 110x, the Y-axis local gradient coil 110y, the Z-axis local gradient coil 110z inside the local coil device 100A respectively form the gradient magnetic fields Gx, Gy, and Gz, and the local RF coil 130a applies each RF pulse to the imaging region IM.

Then, MR signals generated by nuclear magnetic resonance inside the object P are detected by the local RF coil 130a, and the detected MR signals are inputted to the RF receiver 50. The RF receiver 50 performs the above-described predetermined signal processing on the inputted MR signals so as to generate the raw data of MR signals, and outputs these raw data to the image reconstruction function 62 of the processing circuitry 60. The image reconstruction function 62 arranges and stores the raw data of MR signals as k-space data.

Afterward, the processing proceeds to the step S5.

[Step S5] The image reconstruction function 62 reconstructs image data by performing image reconstruction processing including Fourier transform on the k-space data, and stores the reconstructed image data in the memory circuitry 76. The image processing function 64 acquires the reconstructed image data from the memory circuitry 76, generates, for example, two-dimensional display image data by performing predetermined image processing on the reconstructed image data, and stores the display image data in the memory circuitry 76.

Afterward, the system control function 61 causes the display 74 to display images indicated by the display image data.

The foregoing is the description of the operation of the MRI apparatus 10A according in the first embodiment.

As described above, according to the first embodiment, the local coil device 100A can apply a strong gradient magnetic field to a localized region in the imaging space, without using the whole-body coil and the gradient coil 33 in the gantry 30. Thus, in imaging of a head as an example, SNR (Signal to Noise Ratio) can be improved and resolution of an image can be improved.

In addition, a layer of an RF shield is omitted inside the local coil device 100A, and the wiring of the resonance circuit of the local RF coil 130a is folded back at one end side from which the object P is inserted so as to extend from the inner surface of the cylindrical main local gradient coil 110 to the outer periphery of the main local gradient coil 110.

In this structure, it is enough to dispose approximately only a half of the resonance circuit of the local RF coil 130a inside the main local gradient coil 110, and the insertion space of the object P can be widened.

Moreover, since the space for inserting the object P can be further expanded in terms of omitting a shield local gradient coil in the first embodiment, interior comfort for a patient is highly improved.

Second Embodiment

Since the second embodiment is similar to the first embodiment except that the local coil device 100B is configured as an active shield type, only the differences between the first and second embodiments will be described.

Figure 15:
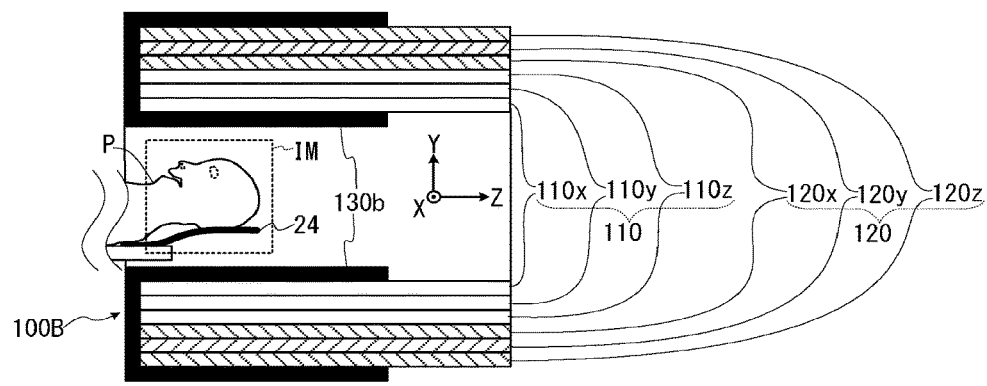
FIG. 15 is a schematic cross-sectional diagram of a Y-Z plane illustrating an example of overall structure of a local coil device of the second embodiment.

FIG. 15 is a schematic cross-sectional diagram of a Y-Z plane illustrating an example of overall structure of the local coil device 100B of the second embodiment. As shown in FIG. 15, the local coil device 100B includes the main local gradient coil 110, a shield local gradient coil 120, and a local RF coil 130b. For distinction in FIG. 15, each component of the shield local gradient coil 120 is indicated by a hatched region and the local RF coil 130b is indicated by a blackly filled region.

The shield local gradient coil 120 is, for example, in the form of a cylinder, and arranged outside the main local gradient coil 110 in order to shield gradient magnetic fields generated by the main local gradient coil 110. This shield local gradient coil 120 includes an X-axis local shield coil 120x, a Y-axis local shield coil 120y, and a Z-axis local shield coil 120z.

An equivalent circuit of the local RF coil 130b is the same as the local RF coil 130a of the first embodiment. Note that the wiring of the local RF coil 130b is folded back so as to extend from the inner periphery of the main local gradient coil 110 to the outer periphery of the shield local gradient coil 120. In other words, since the local RF coil 130b further extend to the outside of the shield local gradient coil 120 which does not included in the structure of the first embodiment and is coaxially arranged outside the main local gradient coil 110, the wiring length of each component of the local RF coil 130b such as the connecting conductors Ra to Rh is different from the local RF coil 130a of the first embodiment.

Figure 16:
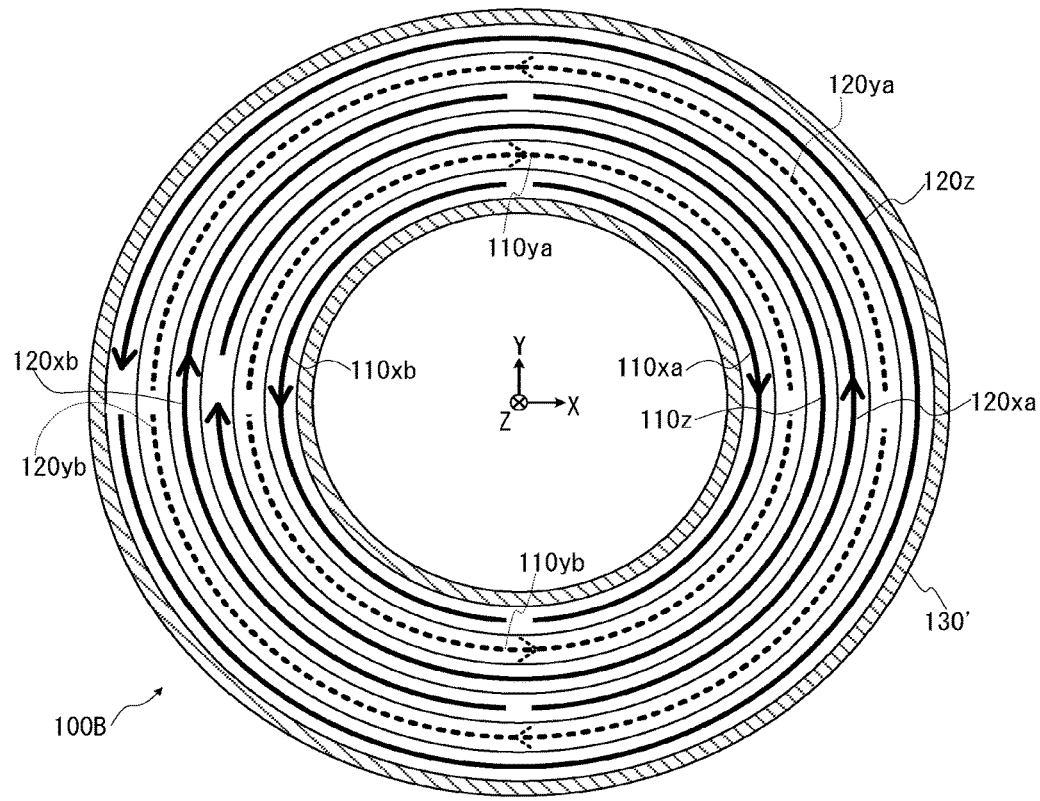
FIG. 16 is a schematic cross-sectional diagram of an X-Y plane illustrating an example of overall structure of the local coil device of the second embodiment.

FIG. 16 is a schematic cross-sectional diagram of an X-Y plane illustrating an example of overall structure of the local coil device 100B of the second embodiment. In FIG. 16, the local RF coil 130b is indicated by the innermost annular hatched region and the outermost annular hatched region. For distinction in FIG. 16, the X-axis local gradient coil 110x, the Z-axis local gradient coil 110z, the X-axis local shield coil 120x, and the Z-axis local shield coil 120z are indicated by solid lines, and the Y-axis local gradient coil 110y and the Y-axis local shield coil 120y are indicated by broken lines.

The X-axis local shield coil 120x, the Y-axis local shield coil 120y, and the Z-axis local shield coil 120z respectively generate an X-axis shield gradient magnetic field Gxs, a Y-axis shield gradient magnetic field Gys, and a Z-axis shield gradient magnetic field Gzs according to electric currents separately provided from the gradient coil power supply 46.

Specifically, the X-axis local shield coil 120x generates the X-axis shield gradient magnetic field Gxs which shields the gradient magnetic field Gx generated by the X-axis local gradient coil 110x, outside the main local gradient coil 110. This X-axis local shield coil 120x is composed of a first X-axis local shield coil 120xa and a second X-axis local shield coil 120xb which are arranged to become symmetrical about a Y-Z plane.

As an example here, it is assumed that the electric current in the first X-axis local shield coil 120xa and the second X-axis local shield coil 120xb flows upward in the Y-axis direction as shown by the bold arrow in FIG. 16. The wiring of the first X-axis local shield coil 120xa and the wiring of the second X-axis local shield coil 120xb are respectively similar to the wiring of the first X-axis coil 110xa and the wiring of the second X-axis coil 110xb described with reference to FIG. 3 to FIG. 5 in the first embodiment.

The Y-axis local shield coil 120y generates the Y-axis shield gradient magnetic field Gys which shields the gradient magnetic field Gy generated by the Y-axis local gradient coil 110y, outside the main local gradient coil 110. This Y-axis local shield coil 120y is composed of a first Y-axis local shield coil 120ya and a second Y-axis local shield coil 120yb which are symmetrically arranged about an X-Z plane.

As an example here, it is assumed that the electric current in the first Y-axis local shield coil 120ya and the second Y-axis local shield coil 120yb flows from the positive side to the negative side in the X-axis direction as shown by the broken-line arrow shown in FIG. 16. The wiring of the first Y-axis local shield coil 120ya and the wiring of the second Y-axis local shield coil 120yb are respectively similar to the wiring of the first Y-axis coil 110ya and the wiring of the second Y-axis coil 110yb described with reference to FIG. 3 and FIG. 6 in the first embodiment.

The Z-axis local shield coil 120z generates the Z-axis shield gradient magnetic field Gzs which shields the gradient magnetic field Gz generated by the Z-axis local gradient coil 110z, outside the main local gradient coil 110. The wiring of the Z-axis local shield coil 120z is similar to the wiring of the Z-axis local gradient coil 110z described with reference to FIG. 3 and FIG. 7 in the first embodiment.

As described above, the same effects as the first embodiment can be obtained by the local coil device 100B of the second embodiment configured as an active shield type. Moreover, the gradient magnetic fields Gx, Gy, and Gz generated by the main local gradient coil 110 can be shielded by the shield local gradient coil 120.

Hereinafter, two supplementary points on the second embodiment will be described.

Firstly, an example in which the X-axis local shield coil 120x is arranged innermost, the Z-axis local shield coil 120z is arranged outermost, and the Y-axis local shield coil 120y is arranged between them in the shield local gradient coil 120 has been described in FIG. 15 and FIG. 16. However, this is only an example. Out of these three local shield coils 120x, 120y, and 120z, any one may be arranged outermost and any one may be arranged innermost.

Secondly, an insertion layer for inserting iron shims and/or an insertion layer for arranging cooling tubes in which cooling water circulates may be further provided between the layer of the main local gradient coil 110 and the layer of the shield local gradient coil 120. The above-described two points holds true for the next third embodiment.

Third Embodiment

Since the third embodiment is similar to the second embodiment except arrangement of the local RF coil 130a in a local coil device 100C, the difference between the second and third embodiments will be mainly described.

Figure 17:
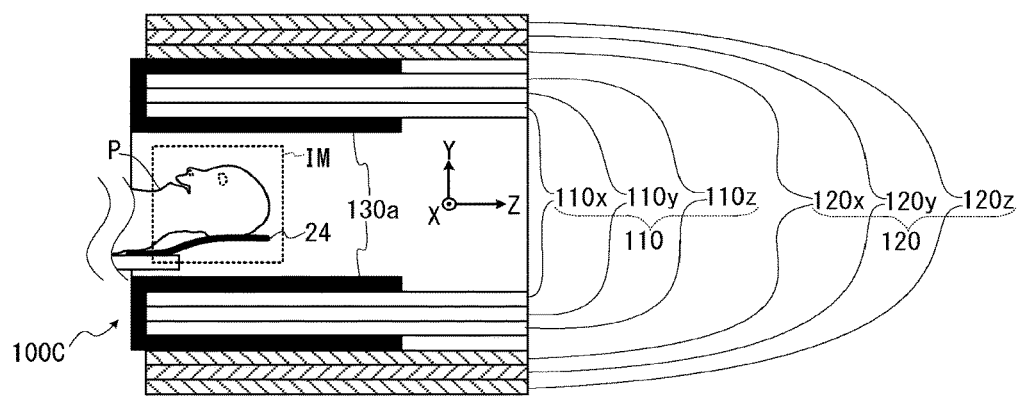
FIG. 17 is a schematic cross-sectional diagram of a Y-Z plane illustrating an example of overall structure of a local coil device of the third embodiment, indicated by the same notation as FIG. 15.

FIG. 17 is a schematic cross-sectional diagram of a Y-Z plane illustrating an example of overall structure of the local coil device 100C of the third embodiment, indicated by the same notation as FIG. 15. As shown in FIG. 17, the local coil device 100C of the third embodiment is configured by coaxially arranging the cylindrical shield local gradient coil 120 outside the entire structure of the local coil device 100A of the first embodiment. In other words, the external wiring of the resonance circuit of the local RF coil 130a in the third embodiment is wired between the main local gradient coil 110 and the shield local gradient coil 120.

As described above, the same effects as the first and second embodiments can be obtained in the third embodiment.

Fourth Embodiment

A local coil device 100D of the fourth embodiment is the same as the local coil device 100A of the first embodiment except that extending region of the local RF coil 130d is changed. Hereinafter, only the difference between the first and fourth embodiments will be described and duplicate description is omitted.

Figure 18:
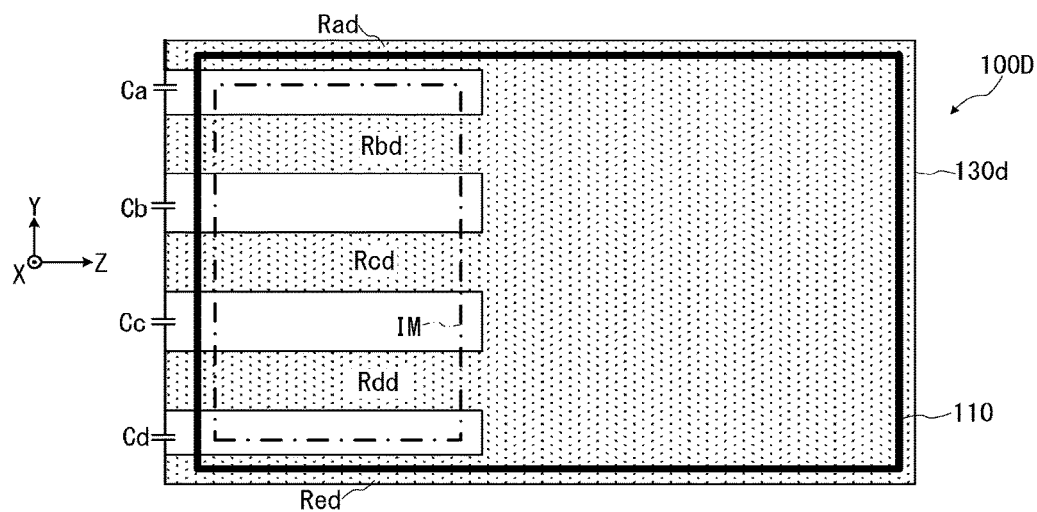
FIG. 18 is a schematic side view illustrating positional relationship between a main local gradient coil and a local RF coil in a local coil device of the fourth embodiment.

FIG. 18 is a schematic side view illustrating positional relationship between the main local gradient coil 110 and a local RF coil 130d of the local coil device 100D in the fourth embodiment. As shown in FIG. 18, the local coil device 100D includes the main local gradient coil 110 and the local RF coil 130d.

An equivalent circuit of the local RF coil 130d is the same as the local RF coil 130a of the first embodiment described with reference to FIG. 8. Although the local RF coil 130a is shorter in the Z-axis direction than the main local gradient coil 110 in the first embodiment (FIG. 9), the size of the local RF coil 130d of the fourth embodiment is large enough to cover the entirety of the main local gradient coil 110.

Thus, length of each of eight connecting conductors of the local RF coil 130d in the Z-axis direction is different from that of the first embodiment. For distinction, respective notations of the eight connecting conductors of the fourth embodiment are defined as Rad, Rbd, Rcd, Rdd, Red, Rfd, Rgd, and Rhd. Since FIG. 18 is a side view observed from one side, the connecting conductors Rfd to Rhd are not illustrated.

Figure 19:
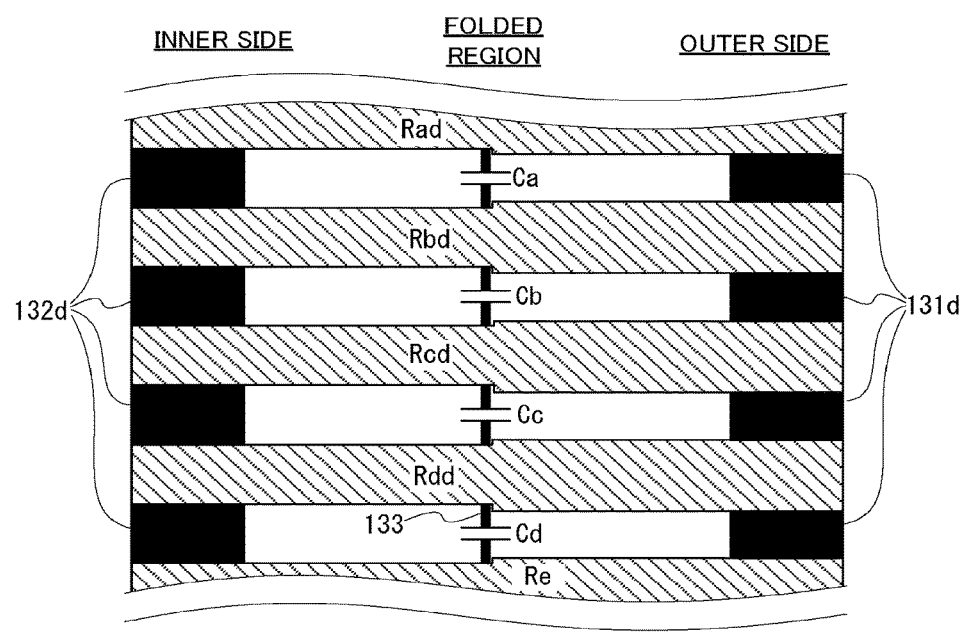
FIG. 19 is a schematic developed circuit diagram of the local RF coil of the local coil device in the fourth embodiment, indicated by the same notation as FIG. 11.

FIG. 19 is a schematic developed circuit diagram of the local RF coil 130d of the local coil device 100D in the fourth embodiment, indicated by the same notation as FIG. 11. Since the local RF coil 130d has size of covering the entirety of the main local gradient coil 110 in the fourth embodiment, the width of the first loop conductor 131d in the Z-axis direction is wider than that of the first loop conductor 131a in the first embodiment as shown in FIG. 19. Similarly, the width of the second loop conductor 132d in the Z-axis direction is wider than that of the second loop conductor 132a in the first embodiment.

As described above, the local coil device 100D of the fourth embodiment is similar to the local coil device 100A of the first embodiment except the width or length of each component of the resonance circuit of the local RF coil 130d. Thus, the same effects as the first embodiment can also be obtained in the fourth embodiment.

Incidentally, the local coil device 100D of the fourth embodiment may be configured as active shield structure by further providing the shield local gradient coil 120 in a manner similar to the second or third embodiment.

Fifth Embodiment

A local coil device 100E of the fifth embodiment is the same as the local coil device 100A of the first embodiment except that the resonance circuit of the local coil device 100A is changed. Hereinafter, the difference between the first and fifth embodiments will be mainly described and duplicate description is omitted.

Figure 20:
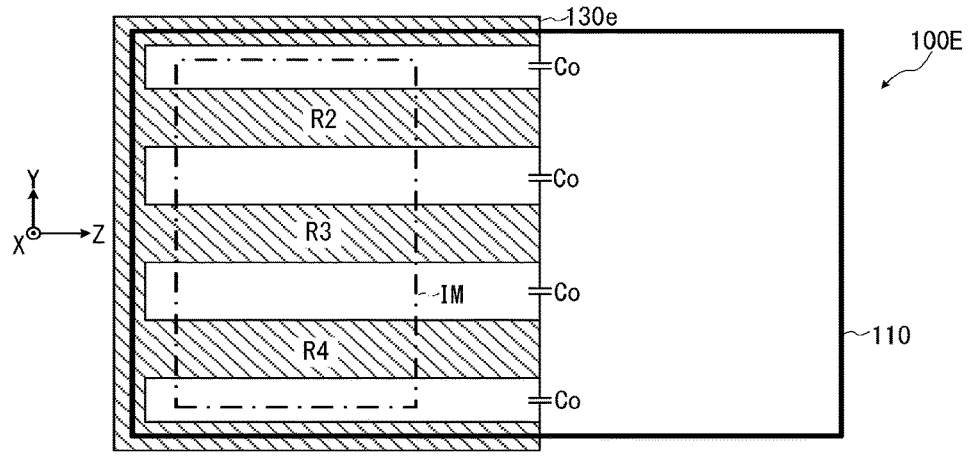
FIG. 20 is a schematic side view illustrating positional relationship between a main local gradient coil and a local RF coil of a local coil device in the fifth embodiment.

FIG. 20 is a schematic side view illustrating positional relationship between the main local gradient coil 110 and a local RF coil 130e of the local coil device 100E in the fifth embodiment. As shown in FIG. 20, the local coil device 100E includes the main local gradient coil 110 and the local RF coil 130e. In the fifth embodiment, the length of the local RF coil 130e in the Z-axis direction is shorter than that of the main local gradient coil 110 like the first embodiment.

Figure 21:
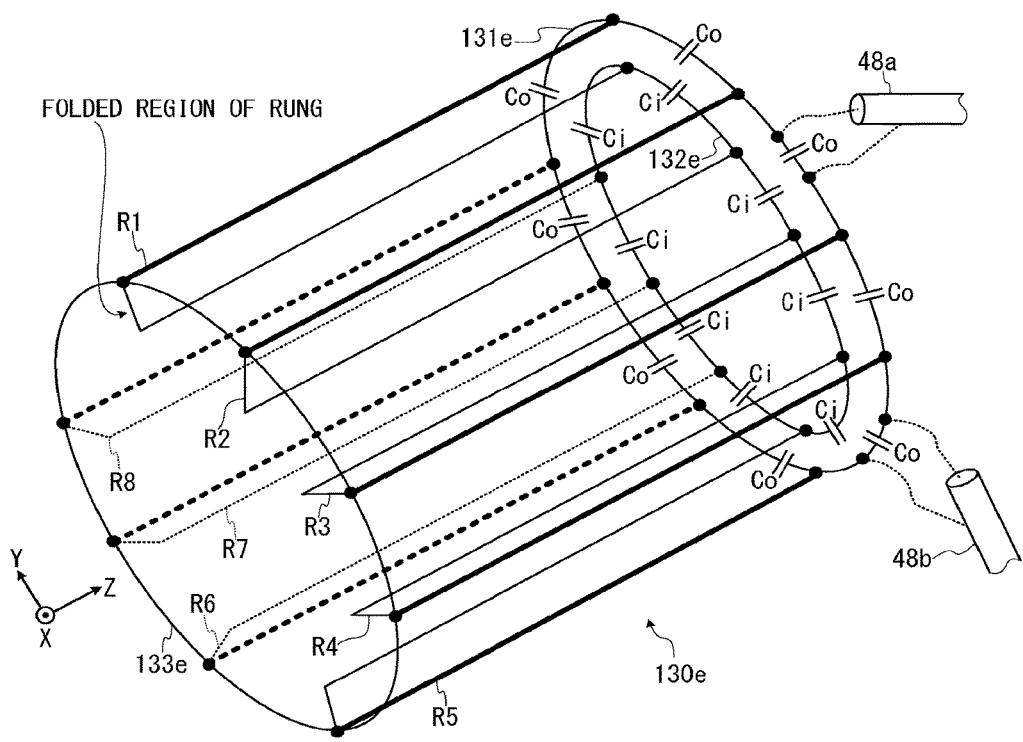
FIG. 21 is a schematic perspective view illustrating an equivalent circuit of the local RF coil of the local coil device in the fifth embodiment, indicated by the same notation as FIG. 8.

FIG. 21 is a schematic perspective view illustrating an equivalent circuit of the local RF coil 130e of the local coil device 100E in the fifth embodiment, indicated by the same notation as FIG. 8. As shown in FIG. 21, the local RF coil 130e includes a first loop conductor 131e, a second loop conductor 132e, a third loop conductor 133e, eight connecting conductors R1, R2, R3, R4, R5, R6, R7, and R8, eight resonance capacitors Co on the external diameter side, and eight resonance capacitors Ci on the internal diameter side.

Out of the two concentric annular wires in parallel with an X-Y plane on the right side of FIG. 21, the outer annular wire is the first loop conductor 131e and the inner annular wire is the second loop conductor 132e. On the left side of FIG. 21, an annular wire in parallel with an X-Y plane is the third loop conductor 133e. Out of all the intersection points between the respective connecting conductors R1 to R8 and the first to third loop conductor 131e to 133e in FIG. 21, the intersection points indicated by blackly filled circles are connection nodes and the remaining intersection points are not connection nodes (i.e., not electrically connected).

In FIG. 21, each of the connecting conductors R1 to R8 is configured of two straight wires extending along the Z-axis direction and one straight wire in parallel with an X-Y plane connecting these two straight wires extending along the Z-axis direction with each other on the side of the third loop conductor 133e. For distinction in FIG. 21, the connecting conductors R1 to R5 on the front side in the X-axis direction are indicated by solid lines and the connecting conductors R6 to R8 on the back side in the X-axis direction are indicated by broken lines. Further, for distinction in FIG. 21, the straight wire on the external diameter side of the wiring of each of the connecting conductors R1 to R8 is indicated by a bold line.

There are eight connection nodes between the first loop conductor 131e and the respective connecting conductors R1 to R8, and the eight resonance capacitors Co are inserted one-by-one in series between these respective eight connection nodes. In addition, there are eight connection nodes between the second loop conductor 132e and the respective connecting conductors R1 to R8, and the eight resonance capacitors Ci are inserted one-by-one in series between these respective eight connection nodes.

Circuit constants of the local RF coil 130e such as (a) capacitance values of the resonance capacitors Co and Ci and (b) inductance of each of three wiring parts of each of the connecting conductors R1 to R8 divided by the two connection nodes connected with the respective second and third loop conductors 132e and 133e are determined so that the resonance frequency of the local RF coil 130e becomes equal to the Larmor frequency.

As an example here, the local coil device 100E is configured to receive power under a QD method from both ends of each of two resonance capacitors Co. Thus, the power transmission cable 48a is connected to both ends of one of the two resonance capacitors Co and the power transmission cable 48b is connected to both ends of the other of two resonance capacitors Co.

Incidentally, the local RF coil 130e is equipped with a function of detecting MR signals of the Larmor frequency emitted from the object P in addition to a function of applying RF pulses of the Larmor frequency. MR signals detected by the local RF coil 130e are outputted to the RF receiver 50 side via non-illustrated wiring.

Figure 22:
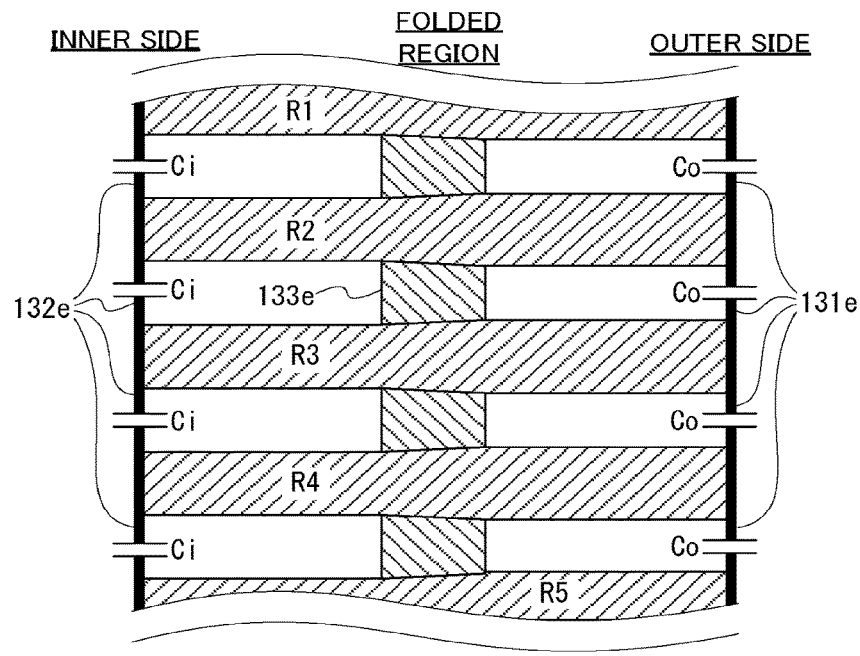
FIG. 22 is a schematic developed circuit diagram of the local RF coil of the local coil device in the fifth embodiment, indicated by the same notation as FIG. 11.

FIG. 22 is a schematic developed circuit diagram of the local RF coil 130e of the local coil device 100E in the fifth embodiment, indicated by the same notation as FIG. 11. Although some components such as the connecting conductors R6 to R8 are omitted for simplicity in FIG. 22, the diagonally left down hatching regions indicate the connecting conductors R1 to R5 and the diagonally right down hatching region indicates the third loop conductor 133e. Each of the connecting conductors R1 to R8 is wider on its outer side than its inner side, with the folded region as a border.

It is preferable in the fifth embodiment that the electric current flowing in the outer side of each of connecting conductors R1 to R8 becomes equal in phase and amplitude to the electric current flowing in its inner side like the first embodiment. As a method of achieving the above-described condition, for example, the connection positions of the resonance capacitors Co and Ci may be adjusted. Additionally or alternatively, the relative width of the conducting body part on the outer side of each of the connecting conductors R1 to R8 to the width of the conducting body part on the inner side of each of the connecting conductors R1 to R8 may be adjusted.

As described above, configuration of the fifth embodiment is similar to the first embodiment except some points in the resonance circuit such as number of the resonance capacitors. Thus, the same effects as the first embodiment can also be obtained in the fifth embodiment.

Incidentally, the local coil device 100E of the fifth embodiment may be configured as active shield structure by further providing the shield local gradient coil 120 in a manner similar to the second or third embodiment.

Sixth Embodiment

A local coil device 100F of the sixth embodiment is the same as the local coil device 100A of the first embodiment except that the resonance circuit of the local coil device 100A is changed. Hereinafter, the difference between the first and sixth embodiments will be mainly described and duplicate description is omitted.

Figure 23:
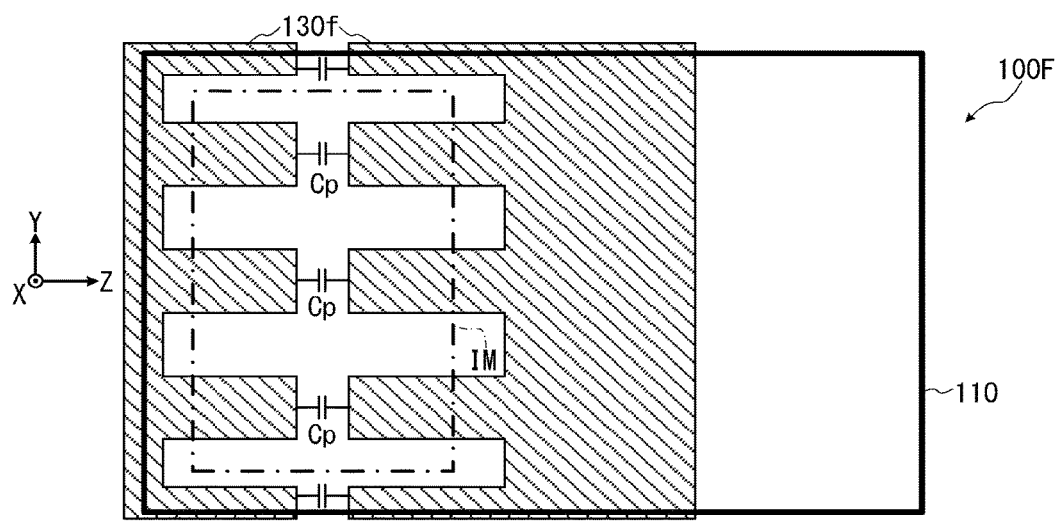
FIG. 23 is a schematic side view illustrating positional relationship between a main local gradient coil and a local RF coil of a local coil device in the sixth embodiment.

FIG. 23 is a schematic side view illustrating positional relationship between the main local gradient coil 110 and a local RF coil 130f of the local coil device 100F in the sixth embodiment. As shown in FIG. 23, the local coil device 100F includes the main local gradient coil 110 and the local RF coil 130f. The sixth embodiment is similar to the first embodiment in that the length of the local RF coil 130f in the Z-axis direction is shorter than that of the main local gradient coil 110 and the entrance side of the local coil device 100F is used as the imaging region IM.

Figure 24:
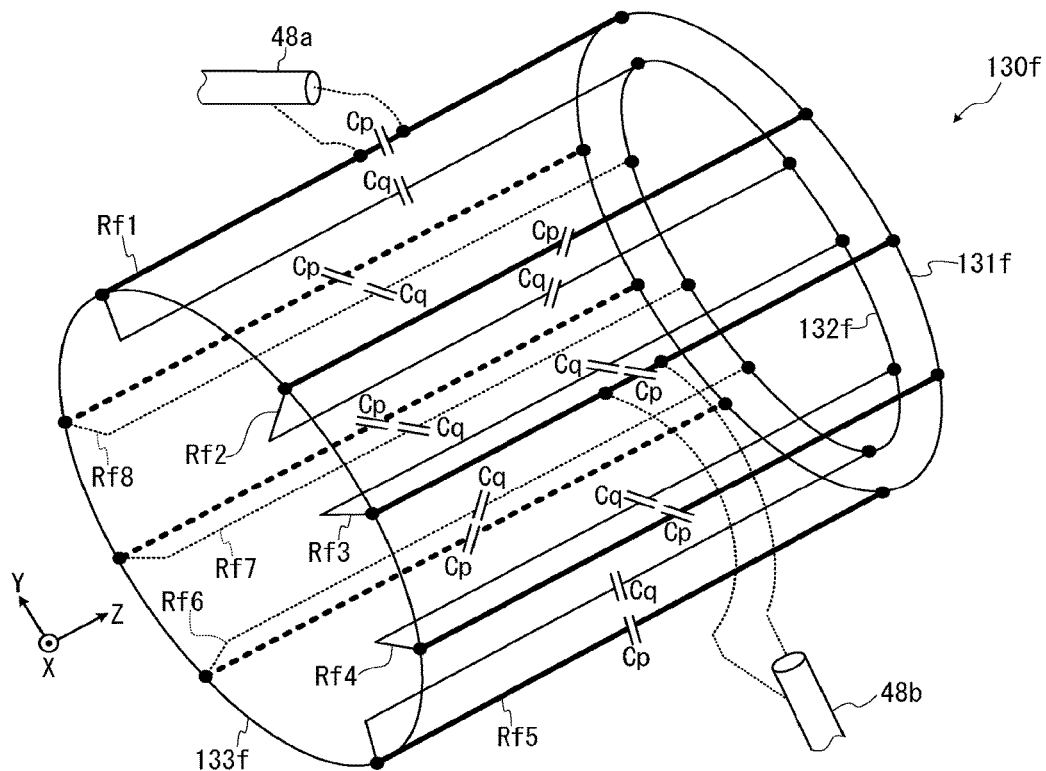
FIG. 24 is a schematic perspective view illustrating an equivalent circuit of the local RF coil of the local coil device in the sixth embodiment, indicated by the same notation as FIG. 21.

FIG. 24 is a schematic perspective view illustrating an equivalent circuit of the local RF coil 130f of the local coil device 100F in the sixth embodiment, indicated by the same notation as FIG. 21. As shown in FIG. 24, the local RF coil 130f includes a first loop conductor 131f, a second loop conductor 132f, a third loop conductor 133f, eight connecting conductors Rf1, Rf2, Rf3, Rf4, Rf5, Rf6, Rf7, and Rf8, eight resonance capacitors Cp on the external diameter side, and eight resonance capacitors Cq on the internal diameter side.

Out of the two concentric annular wires in parallel with an X-Y plane on the right side of FIG. 24, the one on the outer side is the first loop conductor 131f and the other one on the inner side is the second loop conductor 132f. On the left side of FIG. 24, the annular wire in parallel with an X-Y plane is the third loop conductor 133f. Out of all the intersection points between the respective connecting conductors Rf1 to Rf8 and the first to third loop conductors 131f to 133f in FIG. 24, the intersection points indicated by blackly filled circles are connection nodes and the remaining intersection points are not connection nodes (i.e., not electrically connected).

In FIG. 24, each of the connecting conductors Rf1 to Rf8 is configured of two straight wires extending along the Z-axis direction and one straight wire in parallel with an X-Y plane connecting these two straight wires extending along the Z-axis direction with each other. For distinction in FIG. 24, the connecting conductors Rf1 to Rf5 on the front side in the X-axis direction are indicated by solid lines and the connecting conductors Rf6 to Rf8 on the back side in the X-axis direction are indicated by broken lines. Further, for distinction in FIG. 24, the straight wire on the external diameter side of the wiring of each of the connecting conductors Rf1 to Rf8 is indicated by a bold line.

The respective connecting conductors Rf1 to Rf8 are wires similar to the connecting conductors R1 to R8 of the fifth embodiment (FIG. 21), except the connection positions of the resonance capacitors. Although eight resonance capacitors Co are inserted in series in the first loop conductor 131e and eight resonance capacitors Ci are inserted in series in the second loop conductor 132e in the fifth embodiment, two resonance capacitors are inserted in series in each of the connecting conductors Rf1 to Rf8 in the sixth embodiment.

In other words, in each of the connecting conductors Rf1 to Rf8, the resonance capacitor Cp is inserted in series approximately at the center of the straight wiring part extending along the Z-axis direction on the external diameter side and the resonance capacitor Cq is inserted in series approximately at the center of the straight wiring part extending along the Z-axis direction on the internal diameter side.

Circuit constants of the local RF coil 130f such as (a) capacitance values of the resonance capacitors Cp and Cq and (b) inductance of each of four wiring parts of each of the connecting conductors Rf1 to Rf8 divided by the three connection points connected with the resonance capacitor Cp, third loop conductor 133f, and the resonance capacitor Cq are determined so that the resonance frequency of the local RF coil 130f becomes equal to the Larmor frequency.

As an example here, the local coil device 100F is configured to receive power under a QD method from both ends of each of two resonance capacitors Cp. Thus, the power transmission cable 48a is connected to both ends of one of the two resonance capacitors Cp, and the power transmission cable 48b is connected to both ends of the other of the two resonance capacitors Co.

Incidentally, the local RF coil 130f is equipped with a function of detecting MR signals of the Larmor frequency emitted from the object P in addition to a function of applying RF pulses of the Larmor frequency. MR signals detected by the local RF coil 130f are outputted to the RF receiver 50 side via non-illustrated wiring.

Figure 25:
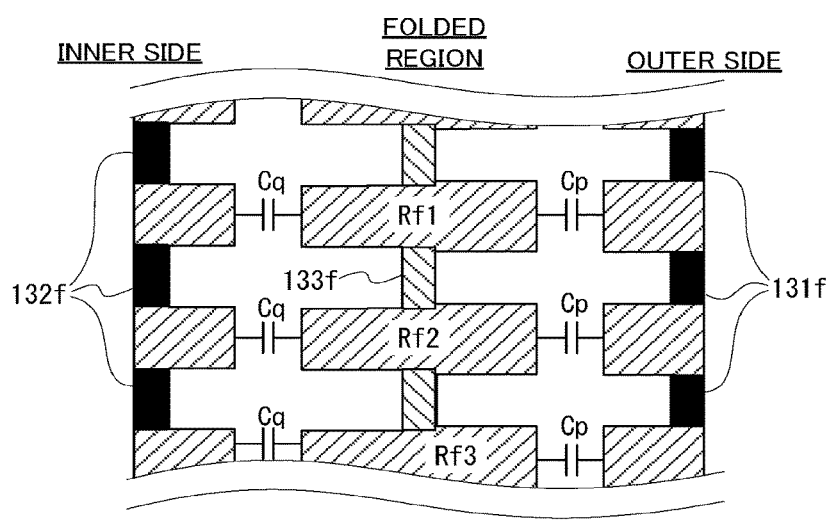
FIG. 25 is a schematic developed circuit diagram of the local RF coil of the local coil device in the sixth embodiment, indicated by the same notation as FIG. 22.

FIG. 25 is a schematic developed circuit diagram of the local RF coil 130f of the local coil device 100F in the sixth embodiment, indicated by the same notation as FIG. 22.

Although some components such as the connecting conductors Rf4 to Rf8 are omitted for simplicity in FIG. 25, the diagonally left down hatching regions indicate the connecting conductors Rf1 to Rf3 and the diagonally right down hatching region indicates the third loop conductor 133f.

It is preferable also in the sixth embodiment that the electric current flowing in the outer side of each of the connecting conductors Rf1 to Rf8 becomes equal in phase and amplitude to the electric current flowing in its inner side, like the fifth embodiment. Methods of achieving the above-described condition are similar to the fifth embodiment. Additionally or alternatively, the capacitance values of the resonance capacitors Cp and Cq may be adjusted to satisfy the above-described condition.

As described above, configuration of the sixth embodiment is similar to the first embodiment except some points in the resonance circuit such as the connection positions of the resonance capacitors Cp and Cq. Thus, the same effects as the first embodiment can also be obtained in the sixth embodiment.

Incidentally, the local coil device 100F of the sixth embodiment may be configured as active shield structure by further providing the shield local gradient coil 120 in a manner similar to the second or third embodiment.

Seventh Embodiment

The seventh embodiment is a modification of the first embodiment in order to use the local coil device 100A of the first embodiment only for the purpose of applying RF pulses and gradient magnetic fields. That is, MR signals are received by another non-illustrated mountable RF coil mounted on the object P in the seventh embodiment.

In other words, the mountable RF coil is mounted on the head of the object P, the table 22 (FIG. 1) with this object P loaded thereon is moved inside the gantry 30. Afterward, the local coil moving device 80 moves the insertion board 82 so that the head of the object P and this mountable RF coil on the headrest 24 are positioned inside the local coil device of the seventh embodiment.

In order to avoid the coupling effect between this mountable RF coil and the local coil device of the seventh embodiment, a detuning circuit is further provided inside the local RF coil in the seventh embodiment. Except this point, the seventh embodiment is similar to the first embodiment. Since only the difference between the first and seventh embodiments will described, a drawing of overall structure of the local coil device of the seventh embodiment is omitted and the symbol of the local coil device of the seventh embodiment is described as 100G for distinction.

Figure 26:
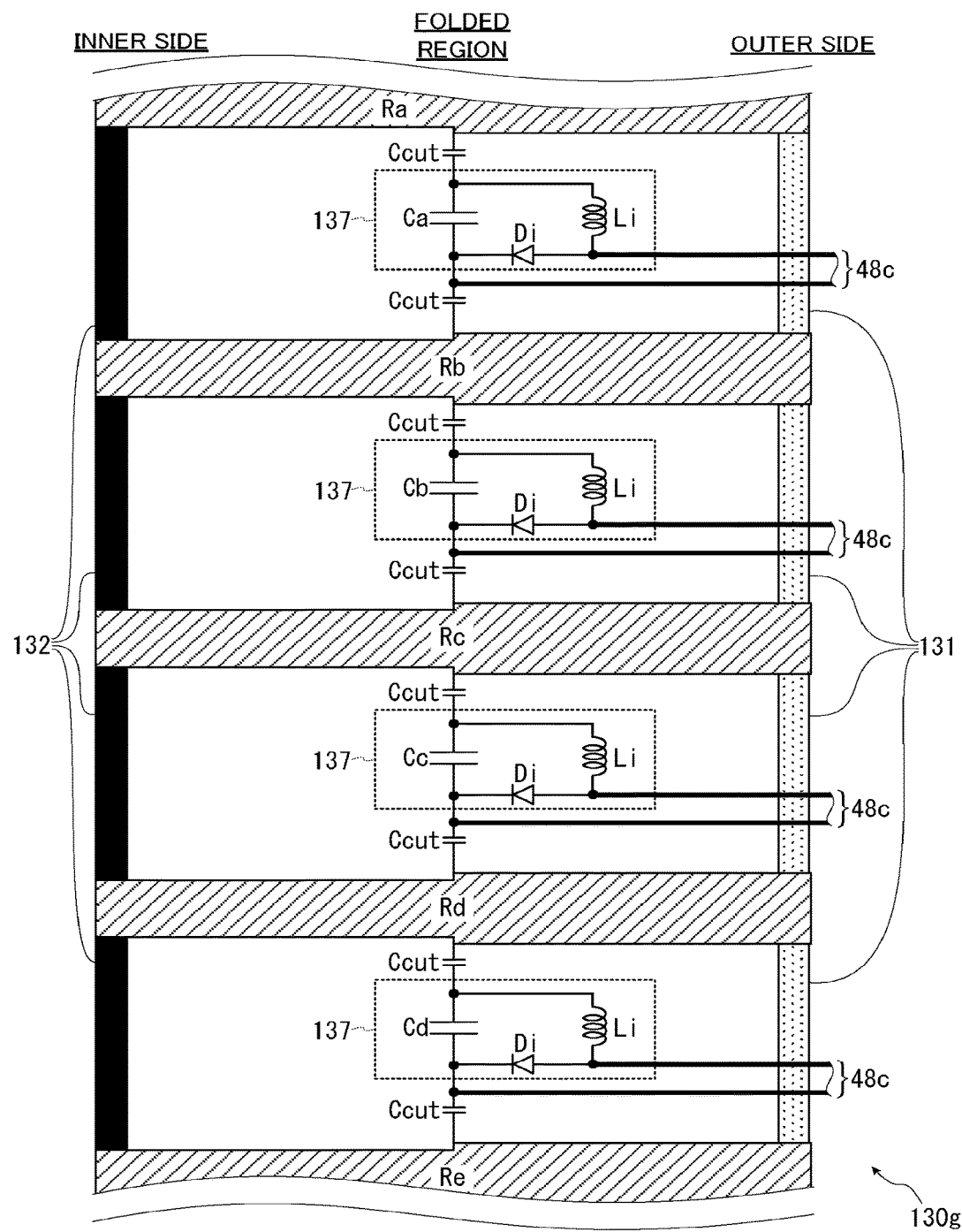
FIG. 26 is a schematic developed circuit diagram of a local RF coil of a local coil device in the seventh embodiment, indicated by the same notation as FIG. 11.

FIG. 26 is a schematic developed circuit diagram of a local RF coil 130g of the local coil device 100G in the seventh embodiment, indicated by the same notation as FIG. 11. In the above-described first embodiment, only the resonance capacitors Ca to Ch are inserted in series one-by-one between the respective connecting conductors Ra to Rh on the folded side of the respective connecting conductors Ra to Rh (i.e., in the third loop conductor 133).

On the other hand, in the seventh embodiment, a detuning circuit is further inserted in the folded side of each of the connecting conductors Ra to Rh. Each of eight detuning circuits is configured by wiring a coil Li, a PIN (p-intrinsic-n) diode Di, and two DC-cut capacitors Ccut as shown in FIG. 26.

Specifically, three capacitors are inserted in series on the folded side of each of the connecting conductors Ra to Rh (i.e., in the third loop conductor 133) in the order of the DC-cut capacitor Ccut, the resonance capacitor (i.e., one of Ca to Ch), and the DC-cut capacitor Ccut. Moreover, a circuit part of connecting the coil Li with the PIN diode Di in series is connected in parallel with the resonance capacitor (i.e., one of Ca to Ch).

One terminal of the feeder cable 48c from the RF transmitter 48 is connected to the connection node of the PIN diode Di and one of the two DC-cut capacitors Ccut, and the other terminal of the feeder cable 48c is connected to the connection node of the coil Li and the PIN diode Di. Although the feeder cable 48c crosses the first loop conductor 131 in FIG. 26, both are not electrically connected to each other.

In the above-described configuration of the resonance circuit of the local RF coil 130g, forward voltage or forward current which turns on the PIN diode Di is supplied via the feeder cable 48c in each period during which an MR signal is detected by another RF coil. Circuit constants of respective components of the local RF coil 130g such as the capacitance values of the respective resonance capacitors Ca to Ch, the inductance value of the coil Li, and the forward resistance value of the PIN diode Di are determined so as to satisfy the condition as follows. That is, an LC circuit 137 composed of the resonance capacitor (i.e., one of Ca to Ch), the coil Li, and the PIN diode Di indicated by a broken-line frame in FIG. 26 becomes a resonant condition at, for example, a frequency of the Larmor frequency band in the turn-on period of the PIN diode Di.

Since each LC circuit 137 is small in size, magnetic fluxes generated by a total of eight LC circuits 137 in a resonant condition are small and do not influence another RF coil in detection of MR signals emitted from the object P. In this case, only the LC circuits 137 are brought into a resonant condition due to forward voltage or forward current supplied via the feeder cable 48c, while all the other components of the local RF coil 130g do not become a resonant condition. Thus, the local RF coil 130g does not resonate due to MR signals emitted from the object P in the turn-on period of the PIN diode Di. Accordingly, the coupling effect between the local RF coil 130g and another RF coil is never caused.

On the other hand, except each period during which an MR signal is detected by another RF coil, power supply via the feeder cable 48c is stopped. Circuit constants of respective components of the local RF coil 130g are determined so that the resonance frequency of the local RF coil 130g becomes equal to the Larmor frequency in each period during which power supply via the feeder cable 48c is stopped. Since additional circuit components such as DC-cut capacitors Ccut are included in the local RF coil 130g as compared with the first embodiment, the capacitance value of each of the resonance capacitors Ca to Ch may be slightly different from that of the first embodiment.

As described above, the same effects as the first embodiment can also be obtained in the seventh embodiment.

Incidentally, the local coil device 100G of the seventh embodiment may be configured as active shield structure by further providing the shield local gradient coil 120 in a manner similar to the second or third embodiment.

Eighth Embodiment

The eighth embodiment is a modification of the fifth embodiment in which the local coil device 100E is used only in application of RF pulses and gradient magnetic fields. That is, MR signals are received by another non-illustrated mountable RF coil mounted on the object P.

In order to avoid the coupling effect between this mountable RF coil and the local coil device of the eighth embodiment, in the eighth embodiment, a total of eight switch circuits 138 are further provided to a position corresponding to the third loop conductor 133e of the local RF coil 130e of the fifth embodiment. Except this point, the eighth embodiment is similar to the fifth embodiment. Since only the difference between the fifth and eighth embodiments will described, a drawing of overall structure of the local coil device of the eighth embodiment is omitted and the symbol of the local coil device of the eighth embodiment is described as 100H for distinction.

Figure 27:
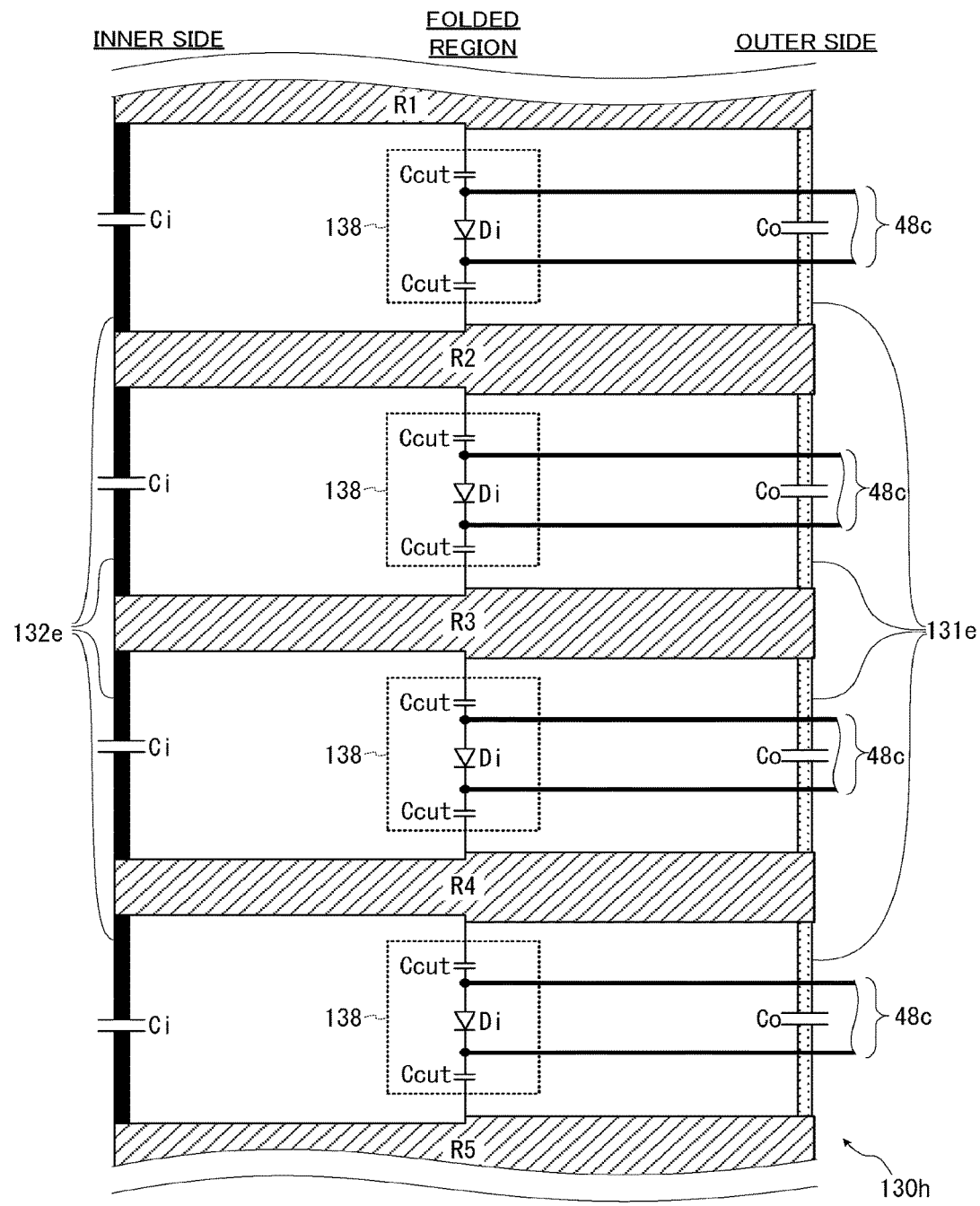
FIG. 27 is a schematic developed circuit diagram of a local RF coil of a local coil device in the eighth embodiment, indicated by the same notation as FIG. 11.

FIG. 27 is a schematic developed circuit diagram of the local RF coil 130h of the local coil device 100H in the eighth embodiment, indicated by the same notation as FIG. 11. In the eighth embodiment, switch circuits 138 are connected on the folded side of the respective connecting conductors R1 to R8. Each of the eight switch circuits 138 is configured by wiring two DC-cut capacitors Ccut and a PIN diode Di in series so that the PIN diode Di is interposed between the two DC-cut capacitors Ccut.

One terminal of the feeder cable 48c from the RF transmitter 48 is connected to the connection node of the PIN diode Di and one of the two DC-cut capacitors Ccut, and the other terminal of the feeder cable 48c is connected to the connection node of the PIN diode Di and the other of the two DC-cut capacitors Ccut. Although the feeder cable 48c crosses the first loop conductor 131e in FIG. 27, both are not electrically connected to each other.

Circuit constants of respective components of the local RF coil 130h such as a capacitance value of each DC-cut capacitor Ccut and the forward resistance value of the PIN diode Di are determined so that the resonance frequency of the local RF coil 130h becomes equal to the Larmor frequency in the turn-on condition of each PIN diode Di.

Since additional circuit components such as DC-cut capacitors Ccut are further included in the local RF coil 130h as compared with the local RF coil 130e of the fifth embodiment, the capacitance value of each of the resonance capacitors Ci and Co may be slightly different from that of the local RF coil 130e in the fifth embodiment.

In each period during which the local RF coil 130h of the local coil device 100H in the eighth embodiment applies an RF pulse, forward voltage or forward current causing the PIN diode Di to become a conductive state is supplied to the local RF coil 130h via the feeder cable 48c. Since the capacitance value of each DC-cut capacitor Ccut is determined to such a value that each DC-cut capacitor Ccut can be substantially regarded as a conductive state with respect to an alternate current of the Larmor frequency, the local RF coil 130h is equivalent to the local RF coil 130e of the fifth embodiment in terms of a circuit and can apply an RF pulse.

On the other hand, in each period during which an MR signal is detected by another RF coil, power is not supplied to the feeder cable 48c and each PIN diode Di of the local RF coil 130h is brought into a non-conductive state. In this case, the respective connecting conductors R1 to R8 are not electrically connected to each other on the folded side and the local RF coil 130h does not become a resonant condition, which prevents the coupling effect between another RF coil and the local RF coil 130h.

Each of the eight switch circuits 138 switches between the conductive state and the non-conductive state with respect to an alternate current of the Larmor frequency, according to voltage or current supplied via the feeder cable 48c in the above-described manner.

Accordingly, the same effects as the first embodiment can also be obtained in the eighth embodiment.

Incidentally, the local coil device 100H of the eighth embodiment may be configured as active shield structure by further providing the shield local gradient coil 120 in a manner similar to the second or third embodiment.

Ninth Embodiment

Since the MRI apparatus 10B of the ninth embodiment is the same as the MRI apparatus 10A of the first embodiment except moving structure of its local coil device, only the difference between both embodiments will be described. Any one of the local coil devices 100A to 100H of the first to the eighth embodiments can be used as a local coil device in the MRI apparatus 10B of the ninth embodiment. Thus, for simplicity in the ninth embodiment, any one of the local coil devices 100A to 100H to be used in the MRI apparatus 10B is referred to as "the local coil device". Further, the shield local gradient coil 120 may be included or may not be included in the ninth embodiment.

Figure 28:
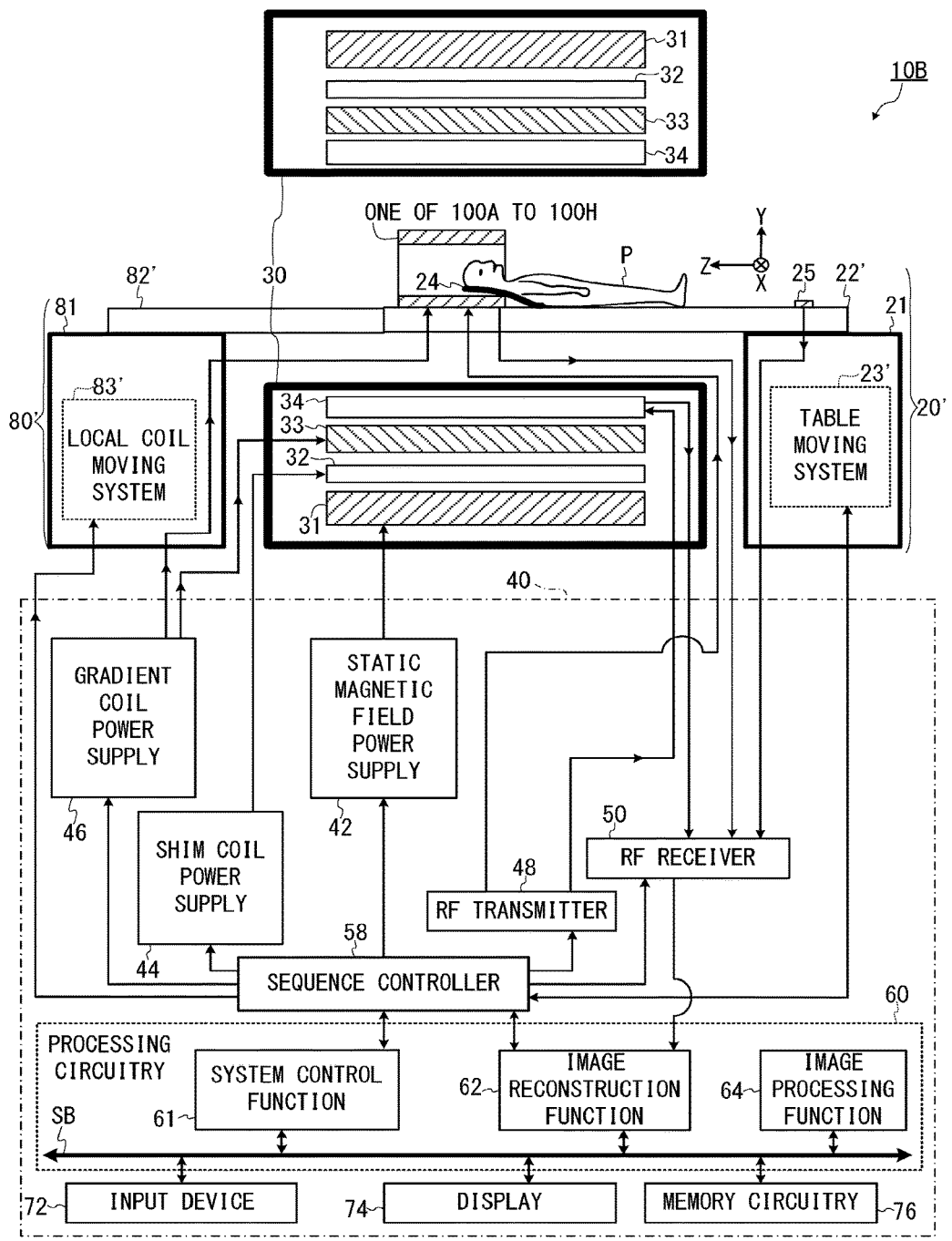
FIG. 28 is a block diagram illustrating an example of overall configuration of an MRI apparatus of the ninth embodiment.

FIG. 28 is a block diagram illustrating an example of overall configuration of the MRI apparatus 10B of the ninth embodiment. In the MRI apparatus 10A of the first embodiment, the local coil device 100A is fixed on the insertion board 82 of the local coil moving device 80 and the local coil device 100A is moved by horizontal movement of the insertion board 82. Thus, in the MRI apparatus 10A of the first embodiment, the height of the insertion board 82 in the vertical direction becomes lower than that of the table 22.

Meanwhile, in the MRI apparatus 10B of the ninth embodiment, the local coil device is not fixed to an insertion board 82'. In the ninth embodiment, the height of the insertion board 82' of a local coil moving device 80' in the vertical direction becomes equal to that of a table 22' of a bed 20' when the local coil device is moved. This is so that the local coil device is horizontally moved by connecting a belt conveyor 27 of the insertion board 82' with a belt conveyor 27 of the table 22' in the horizontal direction as shown in the next FIG. 29.

Incidentally, the local coil device is connected to each of the gradient coil power supply 46, the RF transmitter 48, and the RF receiver 50 via non-illustrated wiring by way of, for example, the table 22'.

Figure 29:
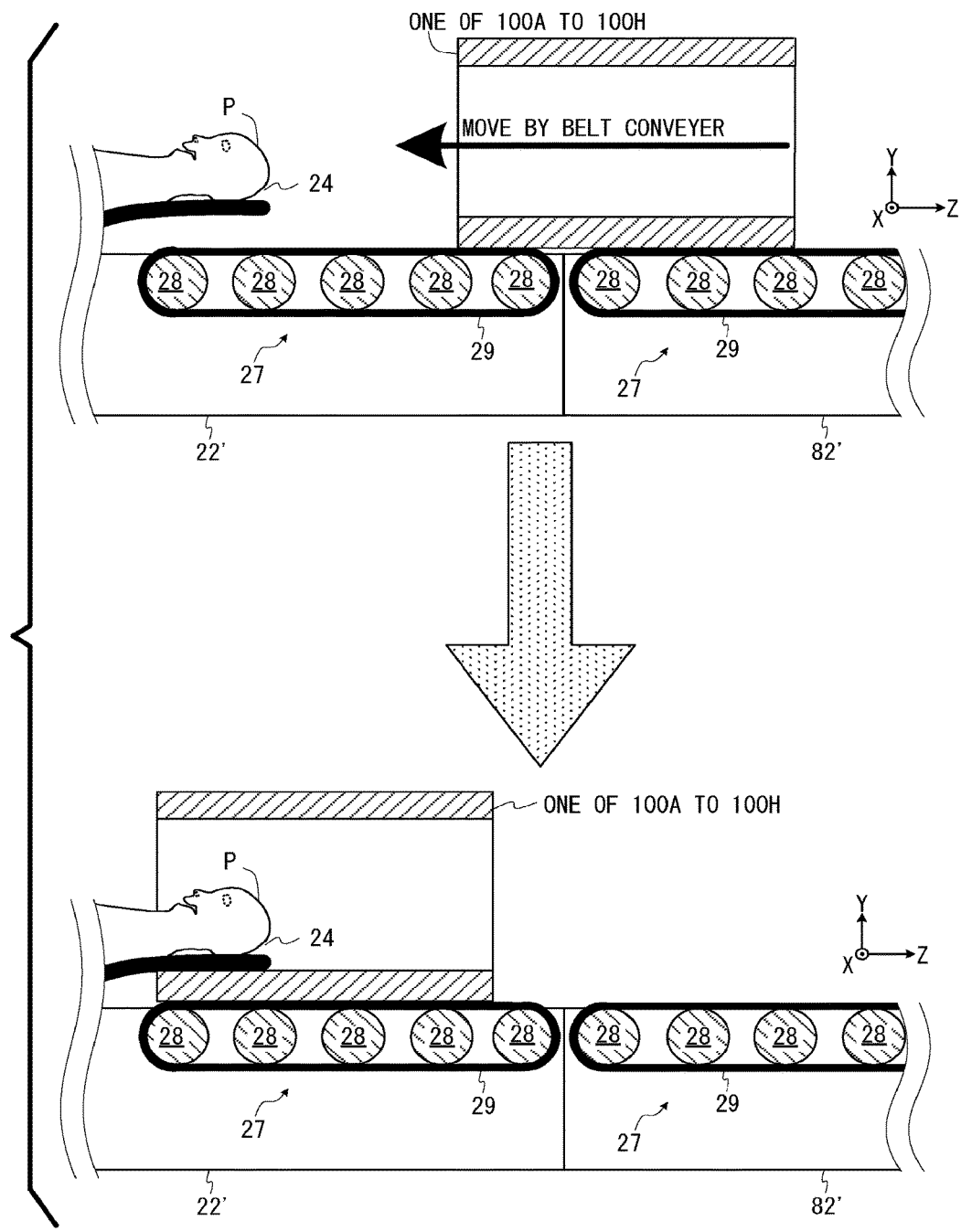
FIG. 29 is a schematic cross-sectional diagram of a table and an insertion board illustrating an example of a method of moving the local coil device in an MRI apparatus of the ninth embodiment.

FIG. 29 is a schematic cross-sectional diagram of the table 22' and the insertion board 82' illustrating an example of a system of moving the local coil device in the MRI apparatus 10B of the ninth embodiment. The upper part of FIG. 29 is a schematic cross-sectional diagram, when the local coil device is in motion in the Z-axis direction. The lower part of FIG. 29 illustrates a state in which the local coil device is moving to a position where the imaging part of the object P is in the hollow region of the local coil device.

As shown in FIG. 29, the belt conveyor (i.e., roller conveyer) 27 is provided on the top surface of the insertion board 22' of the table 22'. In addition, the same type of belt conveyor 27 is provided on the top surface of the insertion board 82' over the entire length of the insertion board 82' in the Z-axis direction. Each of the belt conveyors 27 includes an endless belt 29 and plural cylindrical rollers 28 indicated by circular regions of diagonally right down hatching. Each of the rollers 28 includes a non-illustrated rotational shaft extending in the X-axis direction, and causes the endless belt 29 to run in a circulating manner by rotating in parallel with a Y-Z plane.

The table moving system 23' of the bed 20' and the local coil moving system 83' (FIG. 28) of the local coil moving device 80' horizontally move the local coil device, by causing the endless belts 29 of the respective belt conveyors 27 to run circulatively in the same direction at the same speed.

More specifically, the local coil device on the belt conveyor 27 of the insertion board 82' is positioned outside the gantry 30 (i.e., on the side of the supporting platform 81) before imaging. Then, the table moving system 23' moves the table 22' with the object P loaded thereon so that the head of the object P is positioned at the magnetic field center in a manner similar to the first embodiment.

Next, the local coil moving system 83' horizontally moves the insertion board 82' from the side opposite to the supporting platform 21 so that the end of the table 22' is substantially in contact with the end of the insertion board 82'.

Next, the local coil moving system 83' moves the local coil device onto the table 22' by driving the belt conveyor 27 in the insertion board 81', and then the table moving system 23' moves the local coil device by driving the belt conveyor 27 in the table 22' so that the imaging part of the object P is positioned in the hollow region of the local coil device.

As described above, the same effect as the first embodiment can also be obtained in the MRI apparatus 10B of the ninth embodiment. Incidentally, the above-described the belt conveyors 27 are only an example of moving structure of the local coil device. As another example, the belt conveyors 27 may be omitted and an operator may manually place the local coil device on a predetermined position.

According to each of the above-described embodiments, a larger insertion space for an object in a local gradient coil of MRI can be obtained compared with conventional technology.

Tenth Embodiment

Figure 30:
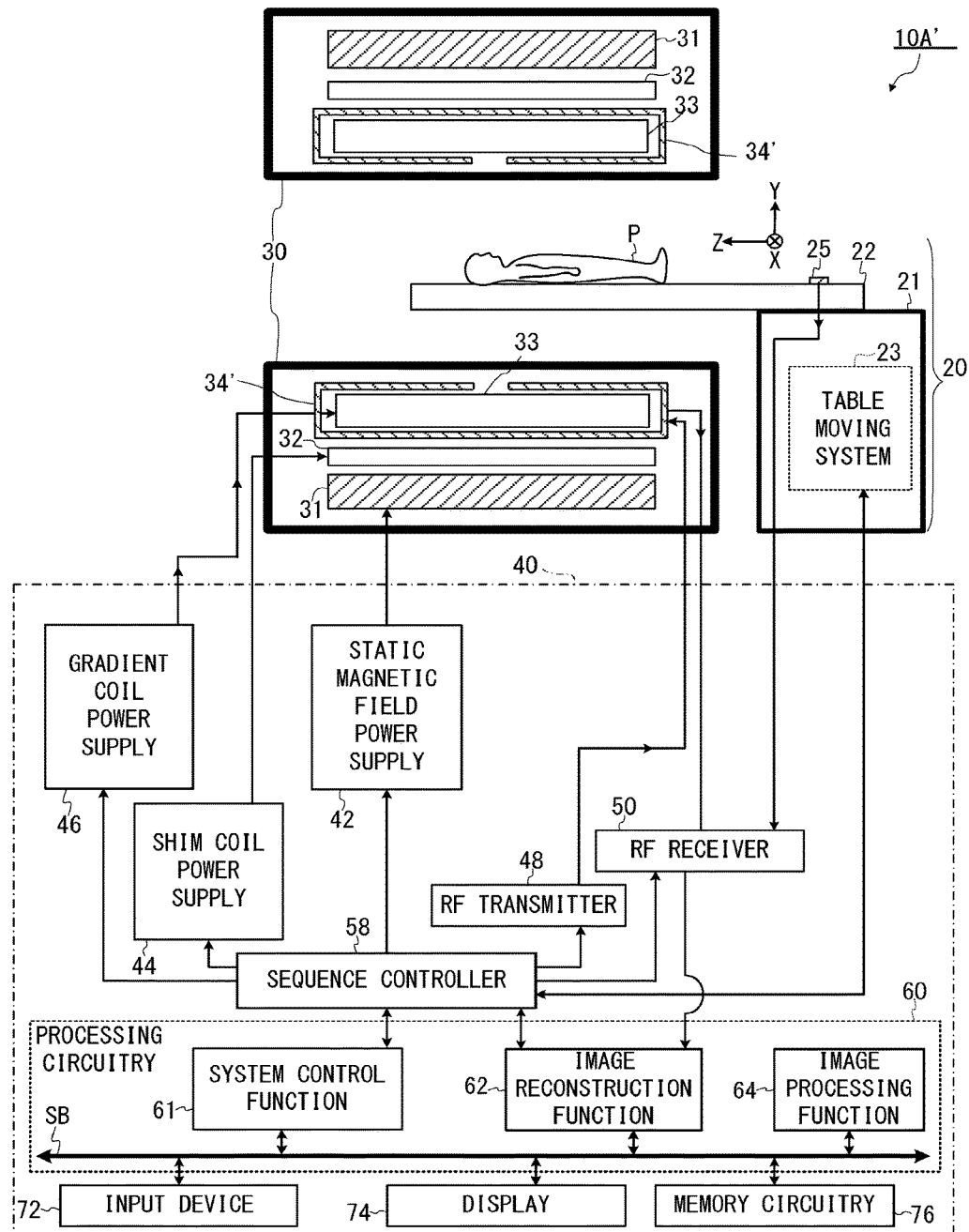
FIG. 30 is a block diagram illustrating an example of overall configuration of an MRI apparatus of the tenth embodiment.

FIG. 30 is a block diagram illustrating an example of configuration of an MRI apparatus 10A' of the tenth embodiment. In each of the MRI apparatuses 10A and 10B of the first to ninth embodiments, the local coil device is positioned inside the RF coil 34 (i.e., the whole-body coil) and includes a local gradient coil and a local RF coil whose plural connecting conductors are folded back and arranged so as to extend from the hollow region of the local coil device to the outer periphery of local gradient coil.

Figure 31:
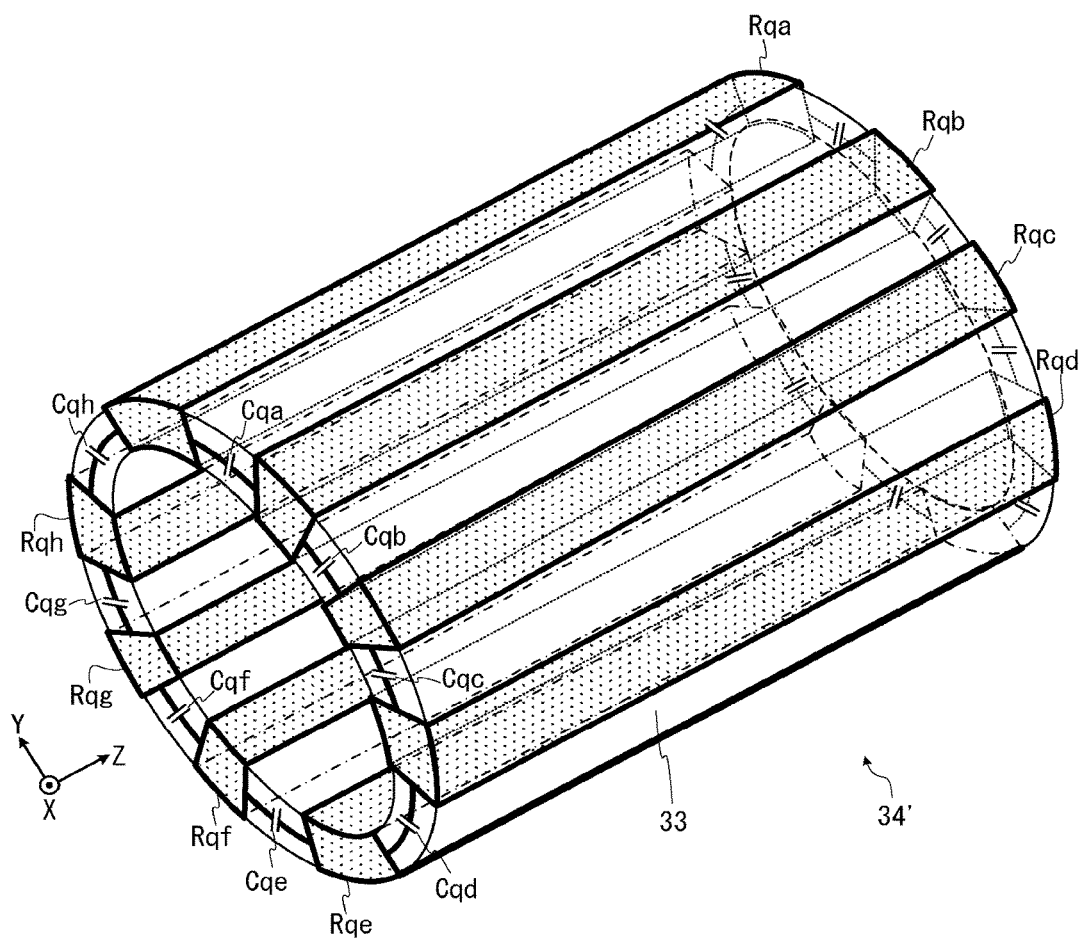
FIG. 31 is a schematic perspective view illustrating the first example of double-layered structure of an RF coil of a local coil device in the tenth embodiment.
Figure 32:
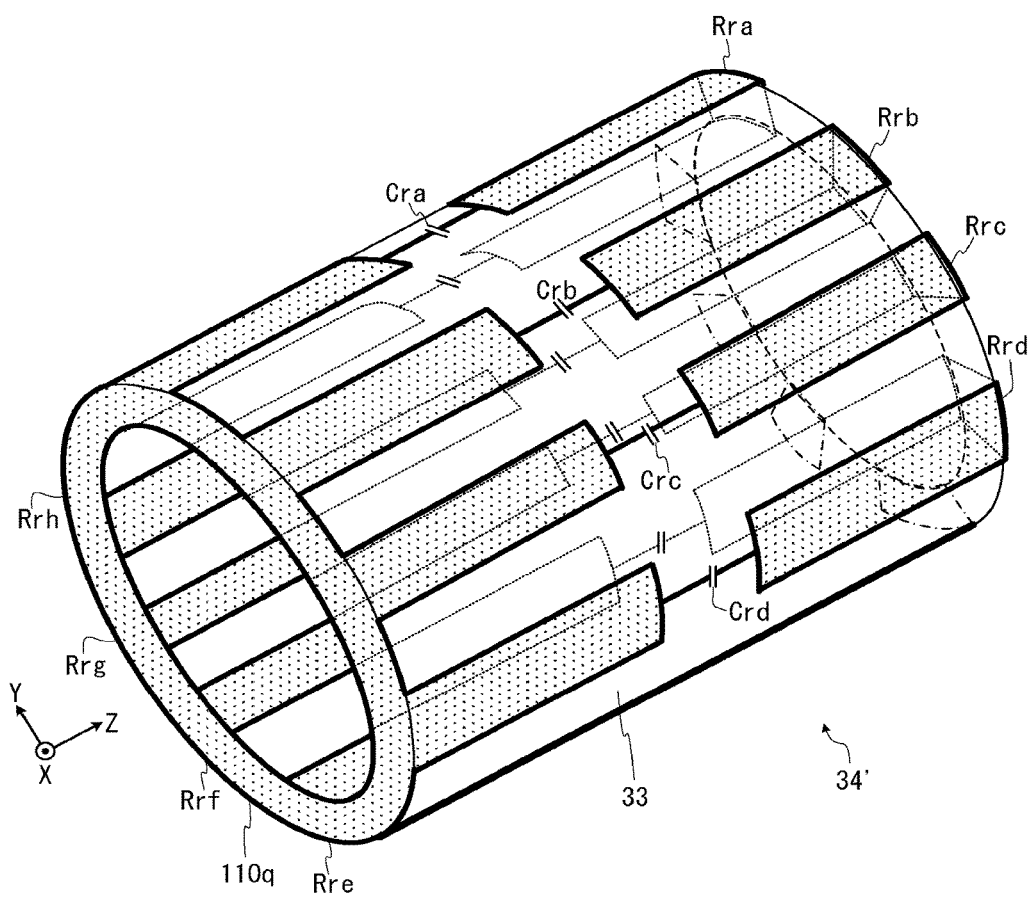
FIG. 32 is a schematic perspective view illustrating the second example of double-layered structure of an RF coil of a local coil device in the tenth embodiment.

By contrast, in the MRI apparatus 10A' of the tenth embodiment, plural connecting conductors of the RF coil 34 (i.e., the whole-body coil) are folded back and arranged so as to extend from the hollow region inside the RF coil 34' to the outer periphery of the gradient coil 33 (i.e., a gradient coil for the whole-body) as shown in FIGS. 30 to 32.

In the local coil device of each of the first to ninth embodiments, not the entire length along the Z-axis direction but a part along the Z-axis direction of the local gradient coil is sandwiched between the outer and inner parts of each of folded connecting conductors of the local RF coil. On the other hand, in the tenth embodiment, approximately the entire length along the Z-axis direction of the gradient coil 33 is covered with the RF coil 34' of double-layered structure as shown in FIGS. 30 to 32.

FIG. 31 is a schematic perspective view illustrating the first example of the double-layered structure of the RF coil 34'. In this first structure, each of eight connecting conductors Rqa to Rqh are circularly arranged at equal intervals and are folded back at one or both ends of the RF coil 34' so as to cover the gradient coil 33. At the one or both ends of the RF coil 34', each of the eight connecting conductors Rqa to Rqh are connected to two of the connecting conductors Rqa to Rqh on both sides by eight resonance capacitors Cqa to Cqh inserted one-by-one between the eight connecting conductors Rqa to Rqh. Thereby, the RF coil 34' is configured as a high-pass type birdcage coil.

FIG. 32 is a schematic perspective view illustrating the second example of the double-layered structure of the RF coil 34'. In this second structure, eight connecting conductors Rqa to Rqh and are folded at one or both ends of the RF coil 34' so as to cover the gradient coil 33. At the one or both ends of the RF coil 34', each of the eight connecting conductors Rqa to Rqh are connected to each other by an annular conductor extending in parallel with an X-Y plane. Approximately in the middle of each of the connecting conductors Rqa to Rqh in the Z-axis direction, one part of each of the connecting conductors Rqa to Rqh is connected to its remaining part by each of eight resonance capacitors Cra to Crh, and thereby the RF coil 34' is configured as a low-pass type birdcage coil. Note that four resonance capacitors Cre to Crh are not illustrated in FIG. 32 in order to avoid complication.

Any one of the two birdcage coils shown in FIG. 31 and FIG. 32 is configured so that its connecting conductors are folded back at one end of the RF coil 34' so as to cover the gradient coil 33. In other words, the RF coil 34' and the gradient coil 33 are integrated with each other in terms of structure. As a result, the thickness of the entirety of the RF coil 34' and the gradient coil 33 can be made thinner than that of conventional technology, and the imaging space can be made larger than that made by conventional technology.

Supplementary Notes on Each Embodiment

[1] In each of the above-described embodiments, an example in which each of the local coil devices 100A to 100H and the RF coil 34' is configured as a birdcage type has been described. However, embodiments of the present invention are not limited to such an aspect. For example, technology of each of the above-described embodiments can be applied to a local coil device whose exterior contour is a rectangular parallelepiped or a cylinder, and in which a rectangular parallelepiped hollow region is formed.

[2] In each of the above-described embodiments, an example in which each of the local RF coils 130a, 130b, and 130d to 130h is an eight-element type including eight connecting conductors (such as Ra) and eight or sixteen resonance capacitors has been described. However, embodiments of the present invention are not limited to such an aspect. In terms of supplying power under a QD method, each local RF coil may be configured as a four-element type including four connecting conductors and resonance capacitors whose number is multiples of four. Additionally or alternatively, each local RF coil may be configured as a sixteen-element type including sixteen connecting conductors and resonance capacitors whose number is multiples of sixteen.

In addition, technology of each of the above-described embodiments is not limited to a local RF coil equipped with a resonance circuit configured to receive power under a QD method but can be applied to local RF coils configured to receive power under another method.

[3] Correspondences between terms used in the claims and terms used in the above-described embodiment will be described. Note that the correspondences described below are just some of possible interpretations for reference and should not be construed as limiting the present invention.

The main local gradient coil 110 is an example of a local gradient coil recited in the claims.

The shield local gradient coil 120 is an example of a shied gradient coil recited in the claims.

In the first to eighth embodiments, the local coil moving device 80 is an example of a moving structure recited in the claims.

In the ninth embodiment, the entirety of the insertion board 82' in which the belt conveyor 27 is included, the local coil moving system 83', the table 22' in which the belt conveyor 27 is included, and the table moving system 23' is an example of a moving structure recited in the claims.

[4] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a gradient coil configured to be cylindrically-shaped and to apply a gradient magnetic field to a hollow region into which an object is inserted, the hollow region being formed inside the gradient coil; and
an RF coil configured to include a resonance circuit whose plural connecting conductors are folded back at one end side of the gradient coil so that the resonance circuit extends from the hollow region to an outer region of the gradient coil.

2. The magnetic resonance imaging apparatus according to claim 1,
wherein the gradient coil is a local gradient coil configured to be arranged inside cylindrical structure in which a static magnet field magnet, a whole-body gradient coil, and a whole-body RF coil are included; and
the RF coil is a local RF coil integrated with the local gradient coil.

3. The magnetic resonance imaging apparatus according to claim 1,
wherein the gradient coil is a whole-body gradient coil; and
the RF coil is a whole-body RF coil integrated with the whole-body gradient coil.

4. The magnetic resonance imaging apparatus according to claim 1,
wherein the gradient coil includes a shield gradient coil configured to shield the gradient magnetic field; and
the plural connecting conductors of the resonance circuit are folded back at one end side of the shield gradient coil so that the resonance circuit extends from the hollow region to an outer periphery of the shield gradient coil.

5. The magnetic resonance imaging apparatus according to claim 1,
wherein the RF coil includes plural switch circuits; and
each of the plural switch circuits is connected between two of the plural connecting conductors and switches between a conductive state and a non-conductive state with respect to an alternating current of a Larmor frequency band according to externally supplied power.

6. The magnetic resonance imaging apparatus according to claim 1, wherein the RF coil includes plural detuning circuits; and
each of the plural detuning circuits is connected between two of the plural connecting conductors, includes a diode, and becomes a resonant condition in a period during which an on-voltage bringing the diode into a conductive state is supplied.

7. The magnetic resonance imaging apparatus according to claim 1,
wherein the gradient coil is configured as cylindrical structure whose two annular end planes face each other;
the RF coil is a birdcage type RF coil; and
the plural connecting conductors are folded back via at least one of the two annular end planes so as to extend from a hollow region of the cylindrical structure to an outer periphery of the cylindrical structure.

8. The magnetic resonance imaging apparatus according to claim 7,
wherein a wiring part of each the plural connecting conductors outside the gradient coil extends along a direction from one of the two annular end planes to another of the two annular end planes;
a wiring part of each of the plural connecting conductors inside the hollow region extends along the direction from one of the two annular end planes to another of the two annular end planes; and
the resonance circuit is configured in such a manner that an electric current value flowing in the wiring part of each of the plural connecting conductors outside the gradient coil becomes equal to an electric current value flowing in the wiring part of each of the plural connecting conductors inside the hollow region.

9. The magnetic resonance imaging apparatus according to claim 8,
wherein the local gradient coil includes an X-axis local gradient coil, a Y-axis local gradient coil, and a Z-axis local gradient coil each of which generates a gradient magnetic field in a direction perpendicular to each other; and the Z-axis local gradient coil includes wiring configured to generate a gradient magnetic field in an axial direction of the cylindrical structure by being wound on a side of one of the two annular end planes in a circumferential direction of the cylindrical structure, without including wiring on a side of another of the two annular end planes.

10. The magnetic resonance imaging apparatus according to claim 9,
wherein each of the X-axis local gradient coil and the Y-axis local gradient coil is configured as spiral wiring so that wiring interval in the axial direction on the side of one of the two annular end planes becomes wider than wiring interval in the axial direction on the side of another of the two annular end plane.

11. The magnetic resonance imaging apparatus according to claim 1,
wherein the RF coil is configured to detect a magnetic resonance signal emitted from the object by the resonance circuit.

12. The magnetic resonance imaging apparatus according to claim 2, further comprising moving structure configured to move the local gradient coil and the local RF coil.

13. A coil device comprising:
a local gradient coil configured to be arranged inside cylindrical structure in which a static magnetic field magnet, a whole-body gradient coil, and a whole-body RF coil are included and to apply a local gradient magnetic field inside the cylindrical structure; and
a local RF coil configured to
(a) include a resonance circuit whose plural connecting conductors are folded back at one end side of the local gradient coil so that the resonance circuit extends from a hollow region inside the local gradient coil to an outer region of the local gradient coil, and
(b) be integrated with the local gradient coil.

* * * * *